(12) United States Patent
Wiegman

(10) Patent No.: US 11,688,889 B2
(45) Date of Patent: Jun. 27, 2023

(54) MONITORING SYSTEM AND METHOD FOR CHARGING MULTIPLE BATTERY PACKS IN AN ELECTRIC AIRCRAFT

(71) Applicant: BETA AIR, LLC, South Burlington, VT (US)

(72) Inventor: Herman Wiegman, South Burlington, VT (US)

(73) Assignee: BETA AIR, LLC, South Burlington, VT (US)

(*) Notice: Subject to any disclaimer, the term of this patent is extended or adjusted under 35 U.S.C. 154(b) by 0 days.

(21) Appl. No.: 17/523,309

(22) Filed: Nov. 10, 2021

(65) Prior Publication Data

US 2023/0145536 A1    May 11, 2023

(51) Int. Cl.
| | | |
|---|---|---|
| *H01M 10/42* | (2006.01) | |
| *B60L 50/64* | (2019.01) | |
| *H01M 50/249* | (2021.01) | |
| *H02J 7/00* | (2006.01) | |
| *G01R 31/392* | (2019.01) | |
| *G01R 31/382* | (2019.01) | |
| *G01R 31/36* | (2020.01) | |

(52) U.S. Cl.
CPC ........... *H01M 10/425* (2013.01); *B60L 50/64* (2019.02); *G01R 31/3648* (2013.01); *G01R 31/382* (2019.01); *G01R 31/392* (2019.01); *H01M 50/249* (2021.01); *H02J 7/0047* (2013.01); *B60L 2200/10* (2013.01); *H01M 2010/4271* (2013.01); *H01M 2220/20* (2013.01)

(58) Field of Classification Search
CPC ............... G01R 31/382; G01R 31/392; G01R 31/3648; H02J 7/0047; H01M 10/425; H01M 2010/4271
USPC ........................................................ 320/132
See application file for complete search history.

(56) References Cited

U.S. PATENT DOCUMENTS

| | | | |
|---|---|---|---|
| 10,110,033 B1 | 10/2018 | Hom | |
| 10,673,252 B2 | 6/2020 | Hom | |
| 11,245,268 B1* | 2/2022 | Trippel | ................. H02J 7/0063 |
| 2010/0327809 A1* | 12/2010 | Takaoka | ............... H01M 10/482 |
| | | | 320/118 |
| 2013/0015819 A1 | 1/2013 | Nakashima | |
| 2017/0353042 A1 | 12/2017 | Liu | |
| 2020/0335998 A1* | 10/2020 | Kawabe | ............. H02J 7/007194 |
| 2021/0178918 A1* | 6/2021 | Qi | ............................. B60L 53/22 |
| 2021/0319152 A1* | 10/2021 | Couture | .................. G06F 30/20 |

(Continued)

*Primary Examiner* — Nathaniel R Pelton
(74) *Attorney, Agent, or Firm* — Caldwell Intellectual Property Law

(57) ABSTRACT

A monitoring system and method for charging multiple battery packs in an electric aircraft is illustrated. The system includes a plurality of submodules, a power bus element, and a computing device. The plurality of battery submodules is coupled to the electric aircraft and each battery submodules comprises a battery management component which comprises a sensor to detect a health metric. The power bus element is electrically connected to each battery submodule of the plurality of battery submodules. A computing device is connected at each battery submodule and is configured to receive the health metric form the sensor, determine a charging status of the battery submodule as a function of the health metric, and charge the battery submodules using the power bus element as a function of the charging status.

18 Claims, 6 Drawing Sheets

(56) References Cited

U.S. PATENT DOCUMENTS

2021/0398365 A1* 12/2021 Kurimoto ............... B60L 53/68
2022/0011782 A1*  1/2022 Mikic ................. B64C 29/0033
2022/0242538 A1*  8/2022 Gonring ............. H01M 10/425

* cited by examiner

MONITORING SYSTEM AND METHOD FOR CHARGING MULTIPLE BATTERY PACKS IN AN ELECTRIC AIRCRAFT

FIELD OF THE INVENTION

The present invention generally relates to the field of electric aircraft. In particular, the present invention is directed to a monitoring system and method for charging multiple battery packs in an electric aircraft.

BACKGROUND

Electric aircrafts may rely upon battery power. Any issues with the battery during flight may cause catastrophic damage to the aircraft and its workers.

SUMMARY OF THE DISCLOSURE

In an aspect, a monitoring system for charging multiple battery packs in an electric aircraft is illustrated. The system includes a plurality of submodules, a power bus element, and a computing device. The plurality of battery submodules is coupled to the electric aircraft and each battery submodules comprises a battery management component which comprises a sensor to detect a health metric. The power bus element is electrically connected to each battery submodule of the plurality of battery submodules. A computing device is connected at each battery submodule and is configured to receive the health metric form the sensor, determine a charging status of the battery submodule as a function of the health metric, and charge the battery submodules using the power bus element as a function of the charging status.

In another aspect, a method for a monitoring system of charging multiple battery packs in an electric aircraft is shown. The method includes coupling a plurality of battery submodules to the electric aircraft, comprising, at each battery submodule of the plurality of battery submodules, a battery management component comprising a sensor configured to detect a health metric, electrically connecting a power bus element to the electric aircraft wherein the bus element is electrically connected to each battery submodule of the plurality of battery submodules, comprising, at the plurality of battery submodules, a computing device, receiving, at the computing device, the health metric from the sensor, determining, at the computing device, a charging status of the battery submodule as a function of the health metric, and charging, at the computing device, the battery submodules using the power bus element as a function of the charging status.

These and other aspects and features of non-limiting embodiments of the present invention will become apparent to those skilled in the art upon review of the following description of specific non-limiting embodiments of the invention in conjunction with the accompanying drawings.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

The drawings are not necessarily to scale and may be illustrated by phantom lines, diagrammatic representations and fragmentary views. In certain instances, details that are not necessary for an understanding of the embodiments or that render other details difficult to perceive may have been omitted.

DETAILED DESCRIPTION

In the following description, for the purposes of explanation, numerous specific details are set forth in order to provide a thorough understanding of the present invention. It will be apparent, however, that the present invention may be practiced without these specific details. As used herein, the word "exemplary" or "illustrative" means "serving as an example, instance, or illustration." Any implementation described herein as "exemplary" or "illustrative" is not necessarily to be construed as preferred or advantageous over other implementations. All of the implementations described below are exemplary implementations provided to enable persons skilled in the art to make or use the embodiments of the disclosure and are not intended to limit the scope of the disclosure, which is defined by the claims. For purposes of description herein, the terms "upper", "lower", "left", "rear", "right", "front", "vertical", "horizontal", and derivatives thereof shall relate to the invention as oriented in FIG. 1. Furthermore, there is no intention to be bound by any expressed or implied theory presented in the preceding technical field, background, brief summary or the following detailed description. It is also to be understood that the specific devices and processes illustrated in the attached drawings, and described in the following specification, are simply exemplary embodiments of the inventive concepts defined in the appended claims. Hence, specific dimensions and other physical characteristics relating to the embodiments disclosed herein are not to be considered as limiting, unless the claims expressly state otherwise.

At a high level, aspects of the present disclosure are directed to an aircraft with a monitoring system. In an embodiment, this disclosure includes an aircraft configured to include a fuselage and a plurality of flight components attached to the fuselage. Aspects of the present disclosure include battery submodules connected to a power bus element to provide charge to them depending on a health metric. Aspects of the present disclosure include at least a computing device to receive the health metric and decide whether the battery submodule needs to be charged. Exemplary embodiments illustrating aspects of the present disclosure are described below in the context of several specific examples.

Figure 1:
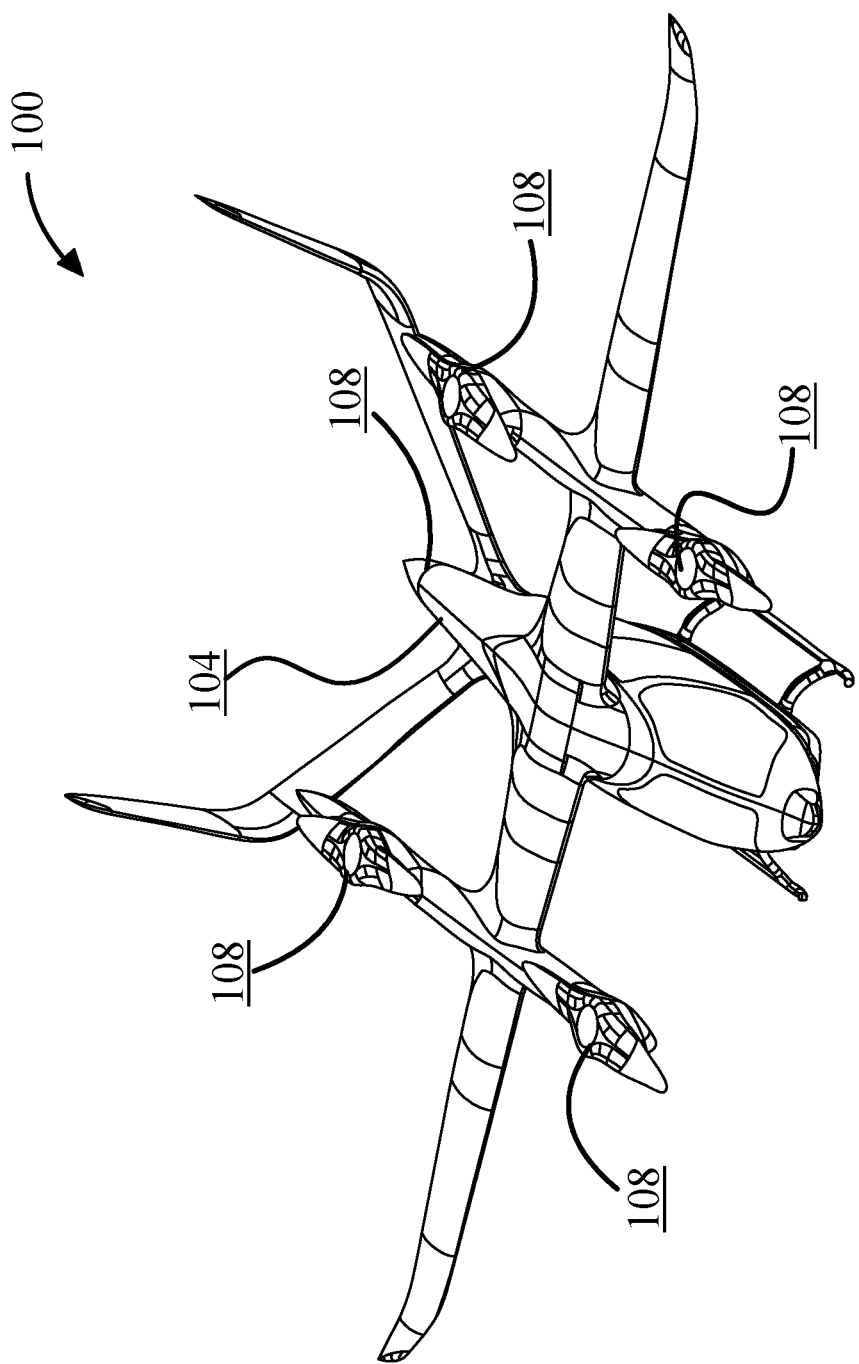
FIG. 1 is a diagrammatic representation of an exemplary embodiment of an electric aircraft.

Referring now to FIG. 1, an exemplary embodiment of an aircraft 100 is illustrated. In an embodiment, aircraft 100 is an electric aircraft. As used in this disclosure an "aircraft" is any vehicle that may fly by gaining support from the air. As a non-limiting example, aircraft may include airplanes, helicopters, commercial and/or recreational aircrafts, instrument flight aircrafts, drones, electric aircrafts, airliners, rotorcrafts, vertical takeoff and landing aircrafts, jets, airships, blimps, gliders, paramotors, and the like. Aircraft 100 may include an electrically powered aircraft. In embodiments, electrically powered aircraft may be an electric vertical takeoff and landing (eVTOL) aircraft. Electric aircraft may be capable of rotor-based cruising flight, rotor-based takeoff, rotor-based landing, fixed-wing cruising flight, airplane-style takeoff, airplane-style landing, and/or any combination thereof. Electric aircraft may include one or more manned and/or unmanned aircrafts. Electric aircraft may include one or more all-electric short takeoff and landing (eSTOL) aircrafts. For example, and without limitation, eSTOL aircrafts may accelerate plane to a flight speed on takeoff and decelerate plane after landing. In an embodiment, and without limitation, electric aircraft may be configured with an electric propulsion assembly. Electric propulsion assembly may include any electric propulsion assembly as described in U.S. Nonprovisional application Ser. No. 16/603,225, filed on Dec. 4, 2019, and entitled "AN INTEGRATED ELECTRIC PROPULSION ASSEMBLY," the entirety of which is incorporated herein by reference.

Still referring to FIG. 1, aircraft 100, may include a fuselage 104, a flight component 108 (or one or more flight components 108), computing device 112, and a sensor 116. Both computing device 112 and sensor 116 are described further herein with reference to FIG. 2.

As used in this disclosure, a vertical take-off and landing (VTOL) aircraft is an aircraft that can hover, take off, and land vertically. An eVTOL, as used in this disclosure, is an electrically powered aircraft typically using an energy source, of a plurality of energy sources to power aircraft. To optimize the power and energy necessary to propel aircraft 100, eVTOL may be capable of rotor-based cruising flight, rotor-based takeoff, rotor-based landing, fixed-wing cruising flight, airplane-style takeoff, airplane style landing, and/or any combination thereof. Rotor-based flight, as described herein, is where aircraft generates lift and propulsion by way of one or more powered rotors or blades coupled with an engine, such as a "quad-copter," multi-rotor helicopter, or other vehicle that maintains its lift primarily using downward thrusting propulsors. "Fixed-wing flight", as described herein, is where aircraft is capable of flight using wings and/or foils that generate lift caused by aircraft's forward airspeed and the shape of the wings and/or foils, such as airplane-style flight.

Still referring to FIG. 1, as used in this disclosure a "fuselage" is a main body of an aircraft, or in other words, the entirety of aircraft except for a cockpit, nose, wings, empennage, nacelles, any and all control surfaces, and generally contains an aircraft's payload. Fuselage 104 may include structural elements that physically support a shape and structure of an aircraft. Structural elements may take a plurality of forms, alone or in combination with other types. Structural elements may vary depending on a construction type of aircraft such as without limitation a fuselage 104. Fuselage 104 may comprise a truss structure. A truss structure may be used with a lightweight aircraft and comprises welded steel tube trusses. A "truss," as used in this disclosure, is an assembly of beams that create a rigid structure, often in combinations of triangles to create three-dimensional shapes. A truss structure may alternatively comprise wood construction in place of steel tubes, or a combination thereof. In embodiments, structural elements may comprise steel tubes and/or wood beams. In an embodiment, and without limitation, structural elements may include an aircraft skin. Aircraft skin may be layered over the body shape constructed by trusses. Aircraft skin may comprise a plurality of materials such as plywood sheets, aluminum, fiberglass, and/or carbon fiber, the latter of which will be addressed in greater detail later herein.

In embodiments, and with continued reference to FIG. 1, aircraft fuselage 104 may include and/or be constructed using geodesic construction. Geodesic structural elements may include stringers wound about formers (which may be alternatively called station frames) in opposing spiral directions. A "stringer," as used in this disclosure, is a general structural element that may include a long, thin, and rigid strip of metal or wood that is mechanically coupled to and spans a distance from, station frame to station frame to create an internal skeleton on which to mechanically couple aircraft skin. A former (or station frame) may include a rigid structural element that is disposed along a length of an interior of aircraft fuselage 104 orthogonal to a longitudinal (nose to tail) axis of aircraft and may form a general shape of fuselage 104. A former may include differing cross-sectional shapes at differing locations along fuselage 104, as the former is the structural element that informs the overall shape of a fuselage 104 curvature. In embodiments, aircraft skin may be anchored to formers and strings such that the outer mold line of a volume encapsulated by formers and stringers comprises the same shape as aircraft 100 when installed. In other words, former(s) may form a fuselage's ribs, and the stringers may form the interstitials between such ribs. The spiral orientation of stringers about formers may provide uniform robustness at any point on an aircraft fuselage such that if a portion sustains damage, another portion may remain largely unaffected. Aircraft skin may be attached to underlying stringers and formers and may interact with a fluid, such as air, to generate lift and perform maneuvers.

In an embodiment, and still referring to FIG. 1, fuselage 104 may include and/or be constructed using monocoque construction. Monocoque construction may include a primary structure that forms a shell (or skin in an aircraft's case) and supports physical loads. Monocoque fuselages are fuselages in which the aircraft skin or shell is also the primary structure. In monocoque construction aircraft skin would support tensile and compressive loads within itself and true monocoque aircraft can be further characterized by the absence of internal structural elements. Aircraft skin in this construction method is rigid and can sustain its shape with no structural assistance form underlying skeleton-like elements. Monocoque fuselage may comprise aircraft skin made from plywood layered in varying grain directions, epoxy-impregnated fiberglass, carbon fiber, or any combination thereof.

According to embodiments, and further referring to FIG. 1, fuselage 104 may include a semi-monocoque construction. Semi-monocoque construction, as used herein, is a partial monocoque construction, wherein a monocoque construction is describe above detail. In semi-monocoque construction, aircraft fuselage 104 may derive some structural support from stressed aircraft skin and some structural support from underlying frame structure made of structural elements. Formers or station frames can be seen running transverse to the long axis of fuselage 104 with circular cutouts which are generally used in real-world manufacturing for weight savings and for the routing of electrical harnesses and other modern on-board systems. In a semi-monocoque construction, stringers are thin, long strips of material that run parallel to fuselage's long axis. Stringers may be mechanically coupled to formers permanently, such as with rivets. Aircraft skin may be mechanically coupled to stringers and formers permanently, such as by rivets as well. A person of ordinary skill in the art will appreciate, upon reviewing the entirety of this disclosure, that there are numerous methods for mechanical fastening of components like screws, nails, dowels, pins, anchors, adhesives like glue or epoxy, or bolts and nuts, to name a few. A subset of fuselage under the umbrella of semi-monocoque construction includes unibody vehicles. Unibody, which is short for "unitized body" or alternatively "unitary construction", vehicles are characterized by a construction in which the body, floor plan, and chassis form a single structure. In the aircraft world, unibody may be characterized by internal structural elements like formers and stringers being constructed in one piece, integral to aircraft skin as well as any floor construction like a deck.

Still referring to FIG. 1, stringers and formers, which may account for the bulk of an aircraft structure excluding monocoque construction, may be arranged in a plurality of orientations depending on aircraft operation and materials. Stringers may be arranged to carry axial (tensile or compressive), shear, bending or torsion forces throughout their overall structure. Due to their coupling to aircraft skin, aerodynamic forces exerted on aircraft skin will be transferred to stringers. A location of said stringers greatly informs the type of forces and loads applied to each and every stringer, all of which may be handled by material selection, cross-sectional area, and mechanical coupling methods of each member. A similar assessment may be made for formers. In general, formers may be significantly larger in cross-sectional area and thickness, depending on location, than stringers. Both stringers and formers may comprise aluminum, aluminum alloys, graphite epoxy composite, steel alloys, titanium, or an undisclosed material alone or in combination.

In an embodiment, and still referring to FIG. 1, stressed skin, when used in semi-monocoque construction is the concept where the skin of an aircraft bears partial, yet significant, load in an overall structural hierarchy. In other words, an internal structure, whether it be a frame of welded tubes, formers and stringers, or some combination, may not be sufficiently strong enough by design to bear all loads. The concept of stressed skin may be applied in monocoque and semi-monocoque construction methods of fuselage 104. Monocoque comprises only structural skin, and in that sense, aircraft skin undergoes stress by applied aerodynamic fluids imparted by the fluid. Stress as used in continuum mechanics may be described in pound-force per square inch (lbf/in$^2$) or Pascals (Pa). In semi-monocoque construction stressed skin may bear part of aerodynamic loads and additionally may impart force on an underlying structure of stringers and formers.

Still referring to FIG. 1, it should be noted that an illustrative embodiment is presented only, and this disclosure in no way limits the form or construction method of a system and method for loading payload into an eVTOL aircraft. In embodiments, fuselage 104 may be configurable based on the needs of the eVTOL per specific mission or objective. The general arrangement of components, structural elements, and hardware associated with storing and/or moving a payload may be added or removed from fuselage 104 as needed, whether it is stowed manually, automatedly, or removed by personnel altogether. Fuselage 104 may be configurable for a plurality of storage options. Bulkheads and dividers may be installed and uninstalled as needed, as well as longitudinal dividers where necessary. Bulkheads and dividers may be installed using integrated slots and hooks, tabs, boss and channel, or hardware like bolts, nuts, screws, nails, clips, pins, and/or dowels, to name a few. Fuselage 104 may also be configurable to accept certain specific cargo containers, or a receptable that can, in turn, accept certain cargo containers.

Still referring to FIG. 1, aircraft 100 may include a plurality of laterally extending elements attached to fuselage 104. As used in this disclosure a "laterally extending element" is an element that projects essentially horizontally from fuselage, including an outrigger, a spar, and/or a fixed wing that extends from fuselage. Wings may be structures which may include airfoils configured to create a pressure differential resulting in lift. Wings may generally dispose on the left and right sides of aircraft symmetrically, at a point between nose and empennage. Wings may comprise a plurality of geometries in planform view, swept swing, tapered, variable wing, triangular, oblong, elliptical, square, among others. A wing's cross section geometry may comprise an airfoil. An "airfoil" as used in this disclosure is a shape specifically designed such that a fluid flowing above and below it exert differing levels of pressure against the top and bottom surface. In embodiments, the bottom surface of an aircraft can be configured to generate a greater pressure than does the top, resulting in lift. Laterally extending element may comprise differing and/or similar cross-sectional geometries over its cord length or the length from wing tip to where wing meets aircraft's body. One or more wings may be symmetrical about aircraft's longitudinal plane, which comprises the longitudinal or roll axis reaching down the center of aircraft through the nose and empennage, and plane's yaw axis. Laterally extending element may comprise controls surfaces configured to be commanded by a pilot or pilots to change a wing's geometry and therefore its interaction with a fluid medium, like air. Control surfaces may comprise flaps, ailerons, tabs, spoilers, and slats, among others. The control surfaces may dispose on the wings in a plurality of locations and arrangements and in embodiments may be disposed at the leading and trailing edges of the wings, and may be configured to deflect up, down, forward, aft, or a combination thereof. An aircraft, including a dual-mode aircraft may comprise a combination of control surfaces to perform maneuvers while flying or on ground.

Still referring to FIG. 1, aircraft 100 may include a plurality of flight components 108. As used in this disclosure a "flight component" is a component that promotes flight and guidance of an aircraft. In an embodiment, flight component 108 may be mechanically coupled to an aircraft. As used herein, a person of ordinary skill in the art would understand "mechanically coupled" to mean that at least a portion of a device, component, or circuit is connected to at least a portion of the aircraft via a mechanical coupling. Said mechanical coupling may include, for example, rigid coupling, such as beam coupling, bellows coupling, bushed pin coupling, constant velocity, split-muff coupling, diaphragm coupling, disc coupling, donut coupling, elastic coupling, flexible coupling, fluid coupling, gear coupling, grid coupling, hirth joints, hydrodynamic coupling, jaw coupling, magnetic coupling, Oldham coupling, sleeve coupling, tapered shaft lock, twin spring coupling, rag joint coupling, universal joints, or any combination thereof. In an embodiment, mechanical coupling may be used to connect the ends of adjacent parts and/or objects of an electric aircraft. Further, in an embodiment, mechanical coupling may be used to join two pieces of rotating electric aircraft components.

Still referring to FIG. 1, plurality of flight components 108 may include at least a lift propulsor. As used in this disclosure a "propulsor" is a component and/or device used to propel a craft upward by exerting force on a fluid medium, which may include a gaseous medium such as air or a liquid medium such as water. Propulsor may include any device or component that consumes electrical power on demand to propel an electric aircraft in a direction or other vehicle while on ground or in-flight. For example, and without limitation, propulsor may include a rotor, propeller, paddle wheel and the like thereof. In an embodiment, propulsor may include a plurality of blades. As used in this disclosure a "blade" is a propeller that converts rotary motion from an engine or other power source into a swirling slipstream. In an embodiment, blade may convert rotary motion to push the propeller forwards or backwards. In an embodiment propulsor may include a rotating power-driven hub, to which are attached several radial airfoil-section blades such that the whole assembly rotates about a longitudinal axis. The lift propulsor is further described herein with reference to FIG. 2.

In an embodiment, and still referring to FIG. 1, plurality of flight components 108 may include one or more power sources. As used in this disclosure a "power source" is a source that that drives and/or controls any other flight component. For example, and without limitation power source may include a motor that operates to move one or more lift propulsor components, to drive one or more blades, or the like thereof. A motor may be driven by direct current (DC) electric power and may include, without limitation, brushless DC electric motors, switched reluctance motors, induction motors, or any combination thereof. A motor may also include electronic speed controllers or other components for regulating motor speed, rotation direction, and/or dynamic braking. In an embodiment, power source may include an inverter. As used in this disclosure an "inverter" is a device that changes one or more currents of a system. For example, and without limitation, inverter may include one or more electronic devices that change direct current to alternating current. As a further non-limiting example, inverter may include receiving a first input voltage and outputting a second voltage, wherein the second voltage is different from the first voltage. In an embodiment, and without limitation, inverter may output a waveform, wherein a waveform may comprise a square wave, sine wave, modified sine wave, near sine wave, and the like thereof.

Still referring to FIG. 1, power source may include an energy source. An energy source may include, for example, a generator, a photovoltaic device, a fuel cell such as a hydrogen fuel cell, direct methanol fuel cell, and/or solid oxide fuel cell, an electric energy storage device (e.g. a capacitor, an inductor, and/or a battery). An energy source may also include a battery cell, or a plurality of battery cells connected in series into a module and each module connected in series or in parallel with other modules. Configuration of an energy source containing connected modules may be designed to meet an energy or power requirement and may be designed to fit within a designated footprint in an electric aircraft in which aircraft 100 may be incorporated.

In an embodiment, and still referring to FIG. 1, an energy source may be used to provide a steady supply of electrical power to a load over the course of a flight by a vehicle or other electric aircraft. For example, the energy source may be capable of providing sufficient power for "cruising" and other relatively low-energy phases of flight. An energy source may also be capable of providing electrical power for some higher-power phases of flight as well, particularly when the energy source is at a high SOC, as may be the case for instance during takeoff. In an embodiment, the energy source may be capable of providing sufficient electrical power for auxiliary loads including without limitation, lighting, navigation, communications, de-icing, steering or other systems requiring power or energy. Further, the energy source may be capable of providing sufficient power for controlled descent and landing protocols, including, without limitation, hovering descent or runway landing. As used herein the energy source may have high power density where the electrical power an energy source can usefully produce per unit of volume and/or mass is relatively high. The electrical power is defined as the rate of electrical energy per unit time. An energy source may include a device for which power that may be produced per unit of volume and/or mass has been optimized, at the expense of the maximal total specific energy density or power capacity, during design. Non-limiting examples of items that may be used as at least an energy source may include batteries used for starting applications including Li ion batteries which may include NCA, NMC, Lithium iron phosphate (LiFePO4) and Lithium Manganese Oxide (LMO) batteries, which may be mixed with another cathode chemistry to provide more specific power if the application requires Li metal batteries, which have a lithium metal anode that provides high power on demand, Li ion batteries that have a silicon or titanite anode, energy source may be used, in an embodiment, to provide electrical power to an electric aircraft or drone, such as an electric aircraft vehicle, during moments requiring high rates of power output, including without limitation takeoff, landing, thermal de-icing and situations requiring greater power output for reasons of stability, such as high turbulence situations, as described in further detail below. A battery may include, without limitation a battery using nickel based chemistries such as nickel cadmium or nickel metal hydride, a battery using lithium ion battery chemistries such as a nickel cobalt aluminum (NCA), nickel manganese cobalt (NMC), lithium iron phosphate (LiFePO4), lithium cobalt oxide (LCO), and/or lithium manganese oxide (LMO), a battery using lithium polymer technology, lead-based batteries such as without limitation lead acid batteries, metal-air batteries, or any other suitable battery. Persons skilled in the art, upon reviewing the entirety of this disclosure, will be aware of various devices of components that may be used as an energy source.

Still referring to FIG. 1, an energy source may include a plurality of energy sources, referred to herein as a module of energy sources. The module may include batteries connected in parallel or in series or a plurality of modules connected either in series or in parallel designed to deliver both the power and energy requirements of the application. Connecting batteries in series may increase the voltage of at least an energy source which may provide more power on demand. High voltage batteries may require cell matching when high peak load is needed. As more cells are connected in strings, there may exist the possibility of one cell failing which may increase resistance in the module and reduce the overall power output as the voltage of the module may decrease as a result of that failing cell. Connecting batteries in parallel may increase total current capacity by decreasing total resistance, and it also may increase overall amp-hour capacity. The overall energy and power outputs of at least an energy source may be based on the individual battery cell performance or an extrapolation based on the measurement of at least an electrical parameter. In an embodiment where the energy source includes a plurality of battery cells, the overall power output capacity may be dependent on the electrical parameters of each individual cell. If one cell experiences high self-discharge during demand, power drawn from at least an energy source may be decreased to avoid damage to the weakest cell. The energy source may further include, without limitation, wiring, conduit, housing, cooling system and battery management system. Persons skilled in the art will be aware, after reviewing the entirety of this disclosure, of many different components of an energy source.

Still referring to FIG. 1, plurality of flight components 108 may include a pusher component. As used in this disclosure a "pusher component" is a component that pushes and/or thrusts an aircraft through a medium. As a non-limiting example, pusher component may include a pusher propeller, a paddle wheel, a pusher motor, a pusher propulsor, and the like. Additionally, or alternatively, pusher flight component may include a plurality of pusher flight components. Pusher component may be configured to produce a forward thrust. As used in this disclosure a "forward thrust" is a thrust that forces aircraft through a medium in a horizontal direction, wherein a horizontal direction is a direction parallel to the longitudinal axis. For example, forward thrust may include a force of 1145 N to force aircraft to in a horizontal direction along the longitudinal axis. As a further non-limiting example, pusher component may twist and/or rotate to pull air behind it and, at the same time, push aircraft 100 forward with an equal amount of force. In an embodiment, and without limitation, the more air forced behind aircraft, the greater the thrust force with which aircraft 100 is pushed horizontally will be. In another embodiment, and without limitation, forward thrust may force aircraft 100 through the medium of relative air. Additionally or alternatively, plurality of flight components 108 may include one or more puller components. As used in this disclosure a "puller component" is a component that pulls and/or tows an aircraft through a medium. As a non-limiting example, puller component may include a flight component such as a puller propeller, a puller motor, a tractor propeller, a puller propulsor, and the like. Additionally, or alternatively, puller component may include a plurality of puller flight components.

Still referring to FIG. 1, aircraft 100 may have computing device 112 attached. Computing device could include but is not limited to a flight controller, simulation device, and the like. As used in this disclosure a "flight controller" is a computing device of a plurality of computing devices dedicated to data storage, security, distribution of traffic for load balancing, and flight instruction. Computing device 112 may include and/or communicate with any other computing device as described in this disclosure, including without limitation a microcontroller, microprocessor, digital signal processor (DSP) and/or system on a chip (SoC) as described in this disclosure. Further, computing device 112 may include a single computing device operating independently, or may include two or more computing device operating in concert, in parallel, sequentially or the like; two or more computing devices may be included together in a single computing device or in two or more computing devices. In embodiments, computing device 112 may be installed in an aircraft, may control the aircraft remotely, and/or may include an element installed in the aircraft and a remote element in communication therewith. In an embodiment, and without limitation, computing device 112 may be configured to command a plurality of flight components, wherein flight components are described in reference to FIG. 1. Computing device 112 may also cover a plurality of devices or one centralized device connected to plurality of batteries. Flight controller is described herein more detail in reference to FIG. 3.

Figure 2:
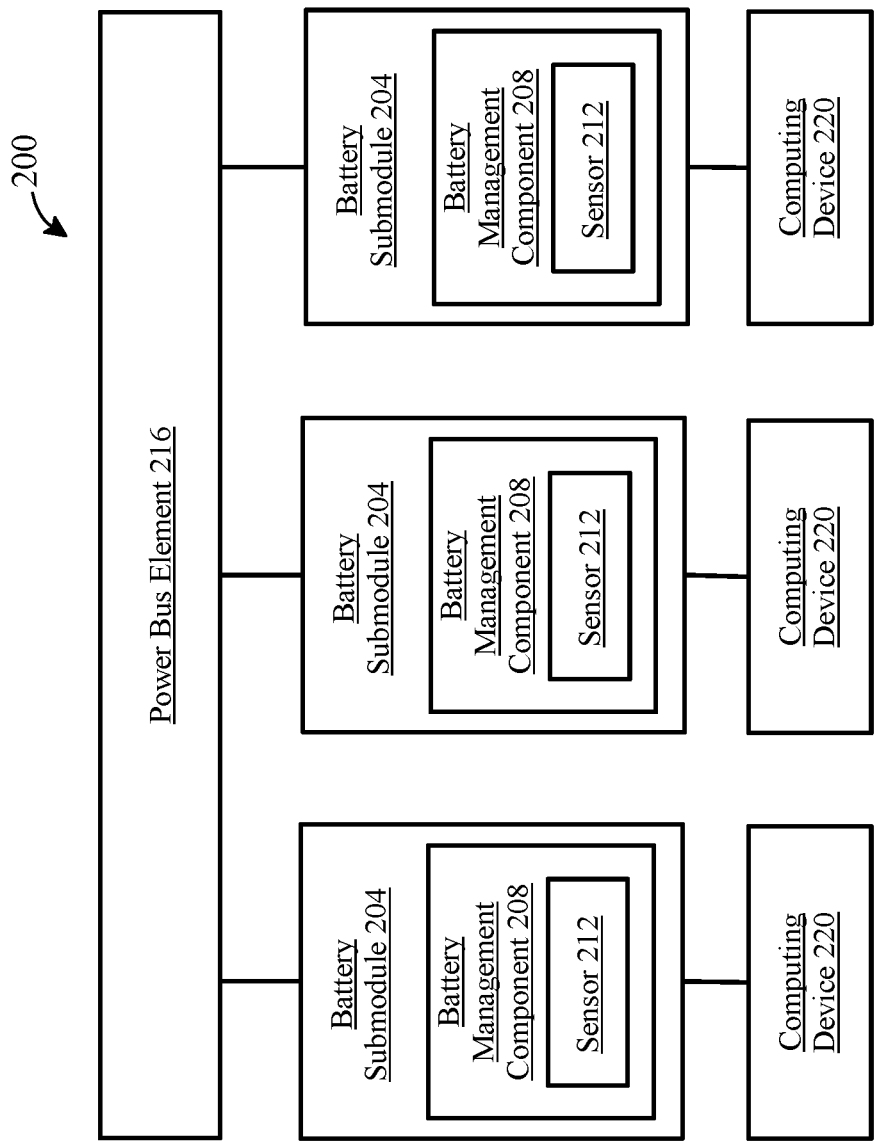
FIG. 2 is a block diagram of an exemplary embodiment of a monitoring system for charging multiple battery packs in an electric aircraft.

Now referring to FIG. 2, system 200 illustrates a block diagram of an exemplary embodiment of a monitoring system for charging multiple battery packs in an electric aircraft. System 200 includes battery submodules 204, battery management components 208, sensors 212, power bus element 216, and computing devices 220.

Still referring to FIG. 2, battery submodules 204 are coupled to aircraft 100. In this disclosure, the term "battery submodules" refers to a plurality of battery modules all powering aircraft 100 through power bus element altogether 216. Battery system includes multiple battery submodules all electrically connected to power bus element 216, which is explained in further detail below. Battery submodules 204 provide power to aircraft 100. Switches or step diodes may be attached to battery submodules to electrically disconnect a failing submodule from power bus element. Each battery submodule 204 may be encapsulated in some sort of can or casing to protect it. If a battery submodule fails during flight, it is disconnected form power bus element and is isolated while the rest of submodules 204 power aircraft 100. Each battery submodule 204 includes a battery management component 208.

Referring still to FIG. 2, each battery submodule 204 comprise a battery management component 208. In this disclosure, a "battery management component" is a piece of technology attached to the battery whose purpose is to manage health of the battery. Battery management component 208 may be integrated in a battery submodule configured for use in an electric aircraft. Battery management component 208 is be integrated in a portion of battery submodule 204 or subassembly thereof. Battery management component 208 is disposed on either end of battery submodule. One of ordinary skill in the art will appreciate that there are various areas in and on a battery submodule and/or subassemblies thereof that may include battery management component 208. Battery management component 208 may take any suitable form. In a non-limiting embodiment, battery management component 208 may include a circuit board, such as a printed circuit board and/or integrated circuit board, a subassembly mechanically coupled to at least a portion of battery submodule 204, standalone components communicatively coupled together, or another undisclosed arrangement of components; for instance, and without limitation, a number of components of battery management component 208 may be soldered or otherwise electrically connected to a circuit board. Battery management component 208 may be disposed directly over, adjacent to, facing, and/or near a battery module and specifically at least a portion of a battery cell. Battery management component 208 includes a sensor. Sensor is configured to detect an altitude value, which is further explained below.

With continued reference to FIG. 2, battery management component 208 disposed in or on battery 204 may be physically isolated from another battery management component also disposed on or in battery submodule. "Physical isolation", for the purposes of this disclosure, refer to a system's components, communicative coupling, and any other constituent parts, whether software or hardware, are separated from a second system's components, communicative coupling, and any other constituent parts, whether software or hardware, respectively. Battery management component 208 may perform the same or different functions in battery system. In a non-limiting embodiment, battery management components 208 perform the same, and therefore redundant functions. If, for example, one battery management component 208 malfunctions, in whole or in part, another battery management component 208 may still be operating properly and therefore battery management system may still operate and function properly for electric aircraft in which it is installed. Additionally or alternatively, battery management components 208 may power on while another battery management component 208 is malfunctioning. In non-limiting embodiments, battery management components 208 may be powered on and operate through the same ground operations of an electric aircraft and through the same flight envelope of an electric aircraft. In non-limiting embodiments, battery management components 208, due to their physical isolation, may be configured to withstand malfunctions or failures in the other system and survive and operate. Provisions may be made to shield one battery management component from another other than physical location such as structures and circuit fuses.

Still referring to FIG. 2, battery management components 208 comprises a sensor 212. As used in this disclosure a "sensor" is a device, module, and/or subsystem, utilizing any hardware, software, and/or any combination thereof to detect events and/or changes in the instant environment and transmit the information; transmission may include transmission of any wired or wireless electronic signal. Sensor 212 may be attached, mechanically coupled, and/or communicatively coupled, as described above, to aircraft. For example, and without limitation, sensor 212 may include a potentiometric sensor, inductive sensor, capacitive sensor, piezoelectric sensor, strain gauge sensor, variable reluctance sensor, and the like thereof. Sensor 212 may include one or more environmental sensors, which may function to sense parameters of the environment surrounding aircraft 100. An environmental sensor may include without limitation one or more sensors used to detect ambient temperature, barometric pressure, and/or air velocity, one or more motion sensors which may include without limitation gyroscopes, accelerometers, inertial measurement unit (IMU), and/or magnetic sensors, one or more humidity sensors, one or more oxygen sensors, or the like. Additionally or alternatively, sensor 212 may include a geospatial sensor. Sensor 212 may be located inside aircraft; and/or be included in and/or attached to at least a portion of aircraft 100. Sensor 212 may include one or more proximity sensors, displacement sensors, vibration sensors, and the like thereof. Sensor 212 may be used to monitor the status of aircraft for both critical and non-critical functions. Sensor 212 may be incorporated into vehicle or aircraft or be remote. Sensor 212 may be communicatively connected to an energy source and/or motor, wherein an energy source and motor are described in detail below, in reference to FIG. 1, and wherein sensor senses one or more conditions of the energy source and/or motor.

Still referring to FIG. 2, at least sensor 212 may further include a sensor suite, sensor suite including a plurality of individual sensors. At least a sensor 212 is configured to detect an altitude value, which is explained below. At least a sensor 212 may further include circuitry or electronic components configured to digitize, transform, or otherwise manipulate electrical signals. Electrical signals may include analog signals, digital signals, periodic or aperiodic signal, step signals, unit impulse signal, unit ramp signal, unit parabolic signal, signum function, exponential signal, rectangular signal, triangular signal, sinusoidal signal, sinc function, or pulse width modulated signal. At least a sensor may include, but not limited to, a pressure sensor, proximity sensor, light sensor, pitot tubes, air speed sensors, and the like. At least a sensor 212 may include a field camera. "Field camera," for the purposes of this disclosure, is an optical device or combination of optical devices, configured to capture a field of vision as an electrical signa, to form a digital image. Field camera may include a single camera and/or two or more cameras used to capture field of vision. In a non-limiting embodiment, two or more cameras may capture two or more perspectives for use in stereoscopic and/or three-dimensional display or remote device. Field camera may capture a feed including a plurality of frames, such as without limitation a video feed.

With continued reference to FIG. 2, at least sensor 212 may include a three-dimensional (3D) scanner. 4D scanner may include the use of 4D laser scanning. 4D Laser Scanning is a non-contact, non-destructive technology that digitally captures the shape of physical objects using a line of laser light. 4D laser scanners create "point clouds" of data from the surface of an object. In other words, 4D laser scanning is a way to capture a physical object's exact size and shape into the computer world as a digital 4-dimensional representation. 4D laser scanners measure fine details and capture free-form shapes to quickly generate highly accurate point clouds. 4D laser scanning is ideally suited to the measurement and inspection of contoured surfaces and complex geometries which require massive amounts of data for their accurate description and where doing this is impractical with the use of traditional measurement methods or a touch probe. In a non-limiting embodiment, a 4D scanner may capture a potential landing zone and generate a 4D model of a plot representing the landing zone for analysis described later in the disclosure.

Still referring to FIG. 2, sensor 212 may include a navigation facility receiver. As used in this disclosure a "navigation facility receiver" is sensor and/or receiver that may locate and/or identify a location of an aircraft with respect to a geolocation. For example and without limitation, navigation facility receiver may include a global positioning system (GPS) receiver. As a further non-limiting example, navigation facility receiver may include a global navigation satellite system (GLONASS) receiver. As a further non-limiting example, navigation facility receiver may include a BeiDou receiver. As a further non-limiting example, navigation facility receiver may include a Galileo receiver. As a further non-limiting example, navigation facility may include a NAVIC receiver. In an embodiment, navigation facility system may include one or more satellite constellation receivers and/or similar emitting systems that can calculate a location based on the time and/or phase difference of the receiver signals. In an embodiment, and without limitation, navigation facility receiver may include a receiving antenna, accompanying circuits, and processing. One or more navigation facility receivers may be configured to determine orientation of aircraft 100 in relation to the Earth's true North, using differential GPS, phase differences, and/or other methods to exploit the satellite constellations and their positions. One or more facility navigation receivers may be configured to receive and determine the local time based on the time information received from the satellite signals. One or more navigation facility receivers may receive position and timing signals, and the like and convert such detected signals into electrical signals, which may be processed further by a flight controller as described in further detail below.

Still referring to FIG. 2, sensor 212 may include an optical sensor. As used in this disclosure an "optical sensor" is an electronic device that alters any parameter of an electronic circuit when contacted by visible or NIR light. Optical detectors may include, without limitation, charge-coupled devices (CCD), photodiodes, avalanche photodiodes (APDs), silicon photo-multipliers (SiPMs), complementary metal-oxide-semiconductor (CMOS), scientific CMOS (sCMOS), micro-channel plates (MCPs), micro-channel plate photomultiplier tubes (MCP-PMTs), single photon avalanche diode (SPAD), Electron Bombarded Active Pixel Sensor (EBAPS), quanta image sensor (QIS), spatial phase imagers (SPI), quantum dot cameras, image intensification tubes, photovoltaic imagers, optical flow sensors and/or imagers, photoresistors and/or photosensitive or photon-detecting circuit elements, semiconductors and/or transducers. APDs, as used herein, are diodes (e.g. without limitation p-n, p-i-n, and others) reverse biased such that a single photon generated carrier can trigger a short, temporary "avalanche" of photocurrent on the order of milliamps or more caused by electrons being accelerated through a high field region of the diode and impact ionizing covalent bonds in the bulk material, these in turn triggering greater impact ionization of electron-hole pairs. APDs may provide a built-in stage of gain through avalanche multiplication. When a reverse bias is less than breakdown voltage, a gain of an APD may be approximately linear. For silicon APDs this gain may be on the order of 10-100. The material of the APD may contribute to gains.

Still referring to FIG. 2, optical sensor may include a light radar component. As used in this disclosure a "light radar component" is an active imaging source that transmits light toward an object or field of interest and detects back-scattered or reflected light, measuring time of flight (ToF), interferometry, and/or phase of such back-scattered and/or reflected light to compute distances to, velocities, and/or accelerations of objects at points from which back-scatter and/or reflection occurred. In an embodiment, the wavelength of light may be outside the range of visible light; for instance, and without limitation, wavelength may be in the infrared range as described above. Light radar component may include a "flash lidar" component, mechanical or non-mechanical beam steering, light patterns, and/or computational imaging methods, such as preoptic or other multi-aperture embodiments. In an embodiment, and without limitation, light radar component may include one or more optical elements for focusing, collimating, and/or transmitting light emitted by light source. In an embodiment, intensity and/or focus may default to minimally harmful settings, permitting allowing ToF ranging or the like to determine a distance to a nearest topographical data point and/or ground point. Light radar component may include detectors that may be sensitive specifically to a narrow band of wavelengths transmitted by light source, and/or may be sensitive to a range of wavelengths that includes the band transmitted by the light source. Detectors may be designed to react quickly to initial detection of photons, for instance through use of APDs or other highly sensitive detectors such as but not limited to ToF detectors. In an embodiment and without limitation, Light radar component may include a phase-based laser scanner. As used in this disclosure a "phase-based laser scanner" is a component that measures a phase shift of a constant beam of laser energy. In an embodiment, and without limitation, phase-based laser scanner may calculate a distance as a function of the measurement of the phase shift of the returning laser energy.

Referring still to FIG. 2, sensors 212 are configured to detect a health metric of battery submodules 204. In this disclosure, "health metric" is a piece of data concerned with the wellness of a specific component, such as a battery submodule. Health metric may include a discharge-related fault condition. In this disclosure, a discharge-related fault condition is a safety check to ensure none of battery submodules 204 will be damaged or cause damage if charged. Health metric may include a cell charge capacity. In this embodiment, "cell charge capacity" is the maximum amount of power that battery submodule 204 can store; however a cell charge capacity value may represent a percentage of submodules maximum power that is currently stored in the battery. Examples of health metrics may include, without limitation, just a simple "yes" or "no" to whether submodules 204 may cause damage, a percentage to represent the battery charge capacity value, "temperature too high" or "too low", and the like. Other examples may just include "poor battery health" or "sufficient battery health". The term "health" refers to how well or healthy a component is; for example but without limitation, sensor may detect temperature, rotational speed, missing parts, age, efficiency, voltage, or the like. Additionally, heath metric may be qualitative or quantitative, such as that something is in "good" health or "poor" health. In some embodiments, to update battery health metric, submodules 204 must be charged in a specific manner so that battery management component 208 can estimate health metric. In order to detect such health datums, each battery management component may further comprise a sensor 212. Sensor 212 is configured to detect a health metric and transmit the datum to computing device 220.

Still referring to FIG. 2, system 200 includes battery submodules 204 electrically connected to a power bus element 216. "Power bus element", for the purposes of this disclosure, is any common connection in electrical parlance to which any number of loads, which may be connected in parallel, and share a relatively similar voltage may be electrically coupled. Power bus element 216 may refer to power busses, audio busses, video busses, computing address busses, and/or data busses. Power bus element 216 may be responsible for conveying electrical energy stored in battery submodules 204 to at least a portion of aircraft 100. The same or a distinct power bus element 216 may additionally or alternatively responsible for conveying electrical signals generated by any number of components within battery submodule 204 to any destination on or offboard aircraft 100. An end cap may comprise wiring or conductive surfaces only in portions required to electrically couple Power bus element 216 to electrical power or necessary circuits to convey that power or signals to their destinations. Power bus element may include any bus element as described in U.S. Nonprovisional application Ser. No. 17/348,240, filed on Jun. 15, 2021, and entitled "SYSTEM AND METHOD FOR DYNAMIC EXCITATION OF AN ENERGY STORAGE ELEMENT CONFIGURED FOR USE IN AN ELECTRIC AIRCRAFT," the entirety of which is incorporated herein by reference.

Referring still to FIG. 2, system 200 includes computing devices 220 connected to each battery submodule 204. In this disclosure, a "computing device" is any electronic equipment controlled by a CPU and may include a computer, tablet, smartphone, or the like. Computing device may include a flight controller. As used in this disclosure a "flight controller" is a computing device of a plurality of computing devices dedicated to data storage, security, distribution of traffic for load balancing, and flight instruction. Flight controller may include and/or communicate with any computing device as described in this disclosure, including without limitation a microcontroller, microprocessor, digital signal processor (DSP) and/or system on a chip (SoC) as described in this disclosure. Further, flight controller may include a single computing device operating independently, or may include two or more computing device operating in concert, in parallel, sequentially or the like; two or more computing devices may be included together in a single computing device or in two or more computing devices. In embodiments, flight controller may be installed in an aircraft, may control aircraft 100 remotely, and/or may include an element installed in aircraft and a remote element in communication therewith. In an embodiment, and without limitation, flight controller may be configured to command a plurality of flight components. Computing device 220 is described further herein with reference to FIGS. 3 and 6. Computing devices 220 are configured to receive health metric from sensors 212.

Still referring to FIG. 2, computing devices 220 are configured to determine a charging status of battery submodules 204 as a function of health metric. As used in this disclosure, a "charging status" is a determination whether a battery submodule's 204 charge capacity value does not exceed charge threshold value, causing it to be charged by power bus element 216. Examples of charging status may just be a simple "yes" or "no" to whether submodule 204 needs to be charged. If health metric received by sensor 212 is quantitative, such as a charge capacity value, then it is compared to a charge threshold value. In this disclosure, a charge threshold value is the value that battery submodules 204's charge capacity value must surpass or else submodule 204 is charge by power bus element 216. Once computing device 220 develops a charging status of battery submodule 204, then this status id used to enact actual charging of submodule 204 or not, which is explained further below. Charging status may be displayed to a user through a remote device. In this disclosure, "remote device" is any visual presentation of data. For example, but without limitation, the outputs may be shown through a sort of computer screen, VR goggles, a tablet, a phone, a gaming device or the like. Other examples may include various types of displays including but not limited to electroluminescent display (ELD), a liquid crystal display (LCD), a light-emitting diode (LED), a plasma display (PDP), and/or a quantum dot display (QLED). Other displays may include a head mounted display, a head-up display, a display incorporated in eyeglasses, googles, headsets, helmet display systems, or the like, a display incorporated in contact lenses, an eye tap display system including without limitation a laser eye tap device, VRD, or the like. When developing remote device, it is important to keep in mind that remote device may need to be easily visually accessible by pilot. Remote device may be part of computing device 220 or sensor 212 or be a completely separate entity in aircraft. Remote device may also be a stereoscopic display, which may denote a display that simulates a user experience of viewing a three-dimensional space and/or object, for instance by simulating and/or replicating different perspectives of a user's two eyes; this is in contrast to a two-dimensional image, in which images presented to each eye are substantially identical, such as may occur when viewing a flat screen display. Stereoscopic display may display two flat images having different perspectives, each to only one eye, which may simulate the appearance of an object or space as seen from the perspective of that eye. Alternatively or additionally, stereoscopic display may include a three-dimensional display such as a holographic display or the like. Persons skilled in the art, upon reviewing the entirety of this disclosure, will be aware of various optical projection and/or remote device technologies that may be incorporated in system 200 consistently with this disclosure.

Referring still to FIG. 2, computing devices 220 are further configured to charge battery submodules 204 using power bus element 216 as a function of charging status. In this disclosure, charge refers to the exchange of power from one device to another. Once computing device 220 generates charging status, computing device 220 translates charging status into one of two options: "charge" or "not charge". Computing device 220 then initiates charging of battery submodule 204 using the electrical connection to power bus element 216, or it does not initiate charging and continues to regulate submodules until charging is necessary.

Referring still to FIG. 2, computing devices periodically perform the charge-and-update, which is the process of updating and charging submodules as explained herein in this disclosure. Charge-and-update includes generating updated charge capacity values for at least one cell in the given battery submodule 204. The determination to perform charge-and-update is based at least in part on a current cycle number associated with charge-and-update. In this disclosure, "current cycle number" is the number is times charge-and-update has occurred during that flight. Furthermore, the determination to perform charge-and-update is based at least in part on a maximum cell voltage being less than an updated threshold voltage. In this disclosure, maximum cell voltage refers to the maximum amount of power battery submodule 204 can store. Updated threshold voltage is charge threshold as previously explained: the specific voltage where if the value is below it, then submodule must be charged. Charge-and-update will not be performed periodically when some state or condition has been met in battery submodule. wherein charging selected battery submodules further includes determining to perform a charge-only including exercising the given battery submodule without updating a health metric.

Figure 3:
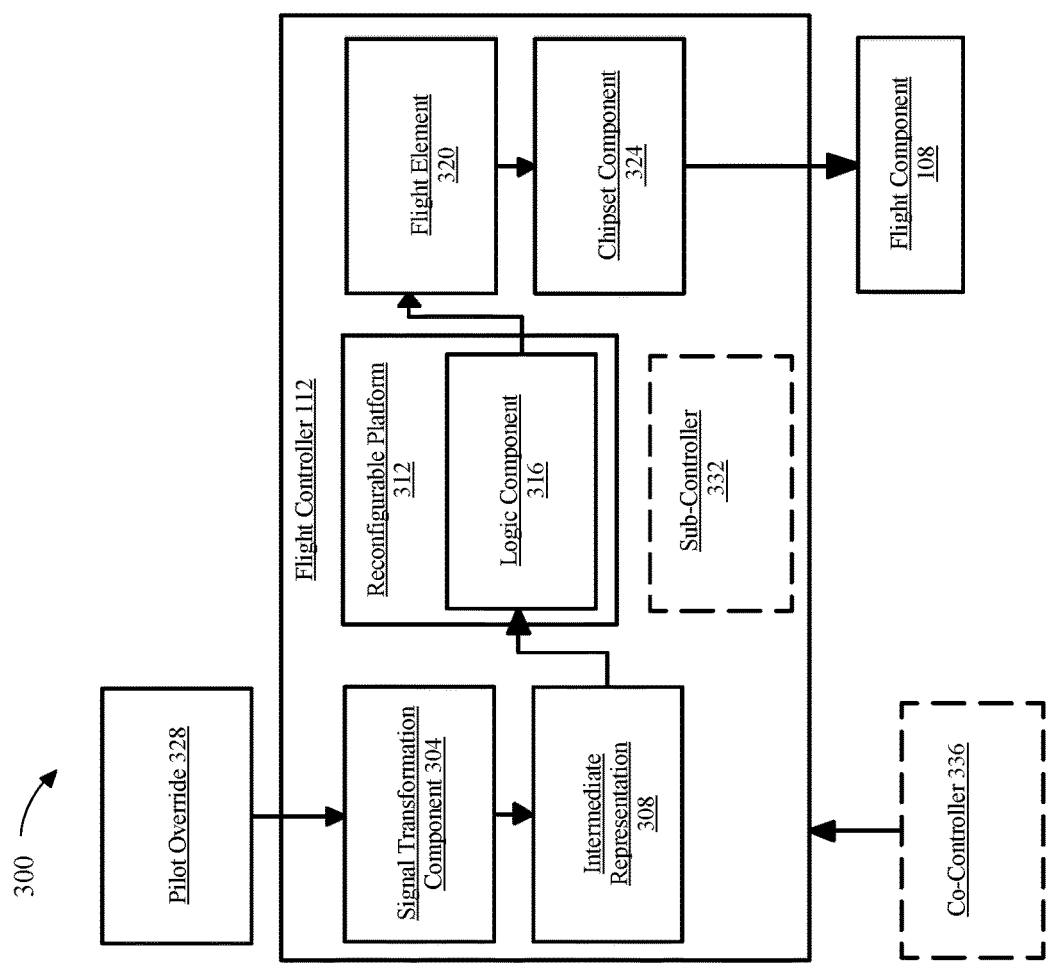
FIG. 3 is a block diagram of an exemplary embodiment of a flight controller

Now referring to FIG. 3, an exemplary embodiment 300 of a possible computing device 112 is illustrated. Thus, a flight controller is illustrated. As used in this disclosure a "flight controller" is a computing device of a plurality of computing devices dedicated to data storage, security, distribution of traffic for load balancing, and flight instruction. Flight controller may include and/or communicate with any computing device as described in this disclosure, including without limitation a microcontroller, microprocessor, digital signal processor (DSP) and/or system on a chip (SoC) as described in this disclosure. Further, flight controller may include a single computing device operating independently, or may include two or more computing device operating in concert, in parallel, sequentially or the like; two or more computing devices may be included together in a single computing device or in two or more computing devices. In embodiments, flight controller may be installed in an aircraft, may control aircraft 100 remotely, and/or may include an element installed in aircraft and a remote element in communication therewith.

In an embodiment, and still referring to FIG. 3, flight controller may include a signal transformation component 308. As used in this disclosure a "signal transformation component" is a component that transforms and/or converts a first signal to a second signal, wherein a signal may include one or more digital and/or analog signals. For example, and without limitation, signal transformation component 308 may be configured to perform one or more operations such as preprocessing, lexical analysis, parsing, semantic analysis, and the like thereof. In an embodiment, and without limitation, signal transformation component 308 may include one or more analog-to-digital convertors that transform a first signal of an analog signal to a second signal of a digital signal. For example, and without limitation, an analog-to-digital converter may convert an analog input signal to a 10-bit binary digital representation of that signal. In another embodiment, signal transformation component 308 may include transforming one or more low-level languages such as, but not limited to, machine languages and/or assembly languages. For example, and without limitation, signal transformation component 308 may include transforming a binary language signal to an assembly language signal. In an embodiment, and without limitation, signal transformation component 308 may include transforming one or more high-level languages and/or formal languages such as but not limited to alphabets, strings, and/or languages. For example, and without limitation, high-level languages may include one or more system languages, scripting languages, domain-specific languages, visual languages, esoteric languages, and the like thereof. As a further non-limiting example, high-level languages may include one or more algebraic formula languages, business data languages, string and list languages, object-oriented languages, and the like thereof.

Still referring to FIG. 3, signal transformation component 308 may be configured to optimize an intermediate representation 312. As used in this disclosure an "intermediate representation" is a data structure and/or code that represents the input signal. Signal transformation component 308 may optimize intermediate representation as a function of a data-flow analysis, dependence analysis, alias analysis, pointer analysis, escape analysis, and the like thereof. In an embodiment, and without limitation, signal transformation component 308 may optimize intermediate representation 312 as a function of one or more inline expansions, dead code eliminations, constant propagation, loop transformations, and/or automatic parallelization functions. In another embodiment, signal transformation component 308 may optimize intermediate representation as a function of a machine dependent optimization such as a peephole optimization, wherein a peephole optimization may rewrite short sequences of code into more efficient sequences of code. Signal transformation component 308 may optimize intermediate representation to generate an output language, wherein an "output language," as used herein, is the native machine language of flight controller. For example, and without limitation, native machine language may include one or more binary and/or numerical languages.

In an embodiment, and without limitation, signal transformation component 308 may include transform one or more inputs and outputs as a function of an error correction code. An error correction code, also known as error correcting code (ECC), is an encoding of a message or lot of data using redundant information, permitting recovery of corrupted data. An ECC may include a block code, in which information is encoded on fixed-size packets and/or blocks of data elements such as symbols of predetermined size, bits, or the like. Reed-Solomon coding, in which message symbols within a symbol set having q symbols are encoded as coefficients of a polynomial of degree less than or equal to a natural number k, over a finite field F with q elements; strings so encoded have a minimum hamming distance of k+1, and permit correction of (q−k−1)/2 erroneous symbols. Block code may alternatively or additionally be implemented using Golay coding, also known as binary Golay coding, Bose-Chaudhuri, Hocquenghuem (BCH) coding, multidimensional parity-check coding, and/or Hamming codes. An ECC may alternatively or additionally be based on a convolutional code.

In an embodiment, and still referring to FIG. 3, flight controller may include a reconfigurable hardware platform 316. A "reconfigurable hardware platform," as used herein, is a component and/or unit of hardware that may be reprogrammed, such that, for instance, a data path between elements such as logic gates or other digital circuit elements may be modified to change an algorithm, state, logical sequence, or the like of the component and/or unit. This may be accomplished with such flexible high-speed computing fabrics as field-programmable gate arrays (FPGAs), which may include a grid of interconnected logic gates, connections between which may be severed and/or restored to program in modified logic. Reconfigurable hardware platform 316 may be reconfigured to enact any algorithm and/or algorithm selection process received from another computing device and/or created using machine-learning processes.

Still referring to FIG. 3, reconfigurable hardware platform 316 may include a logic component 320. As used in this disclosure a "logic component" is a component that executes instructions on output language. For example, and without limitation, logic component may perform basic arithmetic, logic, controlling, input/output operations, and the like thereof. Logic component 320 may include any suitable processor, such as without limitation a component incorporating logical circuitry for performing arithmetic and logical operations, such as an arithmetic and logic unit (ALU), which may be regulated with a state machine and directed by operational inputs from memory and/or sensors; logic component 320 may be organized according to Von Neumann and/or Harvard architecture as a non-limiting example. Logic component 320 may include, incorporate, and/or be incorporated in, without limitation, a microcontroller, microprocessor, digital signal processor (DSP), Field Programmable Gate Array (FPGA), Complex Programmable Logic Device (CPLD), Graphical Processing Unit (GPU), general purpose GPU, Tensor Processing Unit (TPU), analog or mixed signal processor, Trusted Platform Module (TPM), a floating-point unit (FPU), and/or system on a chip (SoC). In an embodiment, logic component 320 may include one or more integrated circuit microprocessors, which may contain one or more central processing units, central processors, and/or main processors, on a single metal-oxide-semiconductor chip. Logic component 320 may be configured to execute a sequence of stored instructions to be performed on the output language and/or intermediate representation 312. Logic component 320 may be configured to fetch and/or retrieve the instruction from a memory cache, wherein a "memory cache," as used in this disclosure, is a stored instruction set on flight controller. Logic component 320 may be configured to decode the instruction retrieved from the memory cache to opcodes and/or operands. Logic component 320 may be configured to execute the instruction on intermediate representation 312 and/or output language. For example, and without limitation, logic component 320 may be configured to execute an addition operation on intermediate representation 312 and/or output language.

In an embodiment, and without limitation, logic component 320 may be configured to calculate a flight element 324. As used in this disclosure a "flight element" is an element of datum denoting a relative status of aircraft. For example, and without limitation, flight element 324 may denote one or more torques, thrusts, airspeed velocities, forces, altitudes, groundspeed velocities, directions during flight, directions facing, forces, orientations, and the like thereof. For example, and without limitation, flight element 324 may denote that aircraft is cruising at an altitude and/or with a sufficient magnitude of forward thrust. As a further non-limiting example, flight status may denote that is building thrust and/or groundspeed velocity in preparation for a takeoff. As a further non-limiting example, flight element 324 may denote that aircraft is following a flight path accurately and/or sufficiently.

Still referring to FIG. 3, flight controller may include a chipset component 328. As used in this disclosure a "chipset component" is a component that manages data flow. In an embodiment, and without limitation, chipset component 328 may include a northbridge data flow path, wherein the northbridge dataflow path may manage data flow from logic component 320 to a high-speed device and/or component, such as a RAM, graphics controller, and the like thereof. In another embodiment, and without limitation, chipset component 328 may include a southbridge data flow path, wherein the southbridge dataflow path may manage data flow from logic component 320 to lower-speed peripheral buses, such as a peripheral component interconnect (PCI), industry standard architecture (ICA), and the like thereof. In an embodiment, and without limitation, southbridge data flow path may include managing data flow between peripheral connections such as ethernet, USB, audio devices, and the like thereof. Additionally or alternatively, chipset component 328 may manage data flow between logic component 320, memory cache, and a flight component 108. As used in this disclosure a "flight component" is a portion of an aircraft that can be moved or adjusted to affect one or more flight elements. For example, flight component 108 may include a component used to affect the aircrafts' roll and pitch which may comprise one or more ailerons. As a further example, flight component 108 may include a rudder to control yaw of an aircraft. In an embodiment, chipset component 328 may be configured to communicate with a plurality of flight components as a function of flight element 324. For example, and without limitation, chipset component 328 may transmit to an aircraft rotor to reduce torque of a first lift propulsor and increase the forward thrust produced by a pusher component to perform a flight maneuver.

In an embodiment, and still referring to FIG. 3, flight controller is configured to produce both autonomous and semi-autonomous flight. As used in this disclosure an "autonomous function" is a mode and/or function of flight controller that controls aircraft automatically. For example, and without limitation, autonomous function may perform one or more aircraft maneuvers, take offs, landings, altitude adjustments, flight leveling adjustments, turns, climbs, and/or descents. As a further non-limiting example, autonomous function may adjust one or more airspeed velocities, thrusts, torques, and/or groundspeed velocities. As a further non-limiting example, autonomous function may perform one or more flight path corrections and/or flight path modifications as a function of flight element 324. In an embodiment, autonomous function may include one or more modes of autonomy such as, but not limited to, autonomous mode, semi-autonomous mode, and/or non-autonomous mode. As used in this disclosure "autonomous mode" is a mode that automatically adjusts and/or controls aircraft and/or the maneuvers of aircraft in its entirety. For example, autonomous mode may denote that flight controller will adjust the aircraft. As used in this disclosure a "semi-autonomous mode" is a mode that automatically adjusts and/or controls a portion and/or section of aircraft. For example, and without limitation, semi-autonomous mode may denote that a pilot will control the propulsors, wherein flight controller will control the ailerons and/or rudders. As used in this disclosure "non-autonomous mode" is a mode that denotes a pilot will control aircraft and/or maneuvers of aircraft in its entirety.

In an embodiment, and still referring to FIG. 3, flight controller may generate autonomous function as a function of an autonomous machine-learning model. As used in this disclosure an "autonomous machine-learning model" is a machine-learning model to produce an autonomous function output given flight element 324 and a pilot signal 336 as inputs; this is in contrast to a non-machine learning software program where the commands to be executed are determined in advance by a user and written in a programming language. As used in this disclosure a "pilot signal" is an element of datum representing one or more functions a pilot is controlling and/or adjusting. For example, pilot signal 336 may denote that a pilot is controlling and/or maneuvering ailerons, wherein the pilot is not in control of the rudders and/or propulsors. In an embodiment, pilot signal 336 may include an implicit signal and/or an explicit signal. For example, and without limitation, pilot signal 336 may include an explicit signal, wherein the pilot explicitly states there is a lack of control and/or desire for autonomous function. As a further non-limiting example, pilot signal 336 may include an explicit signal directing flight controller to control and/or maintain a portion of aircraft, a portion of the flight plan, the entire aircraft, and/or the entire flight plan. As a further non-limiting example, pilot signal 336 may include an implicit signal, wherein flight controller detects a lack of control such as by a malfunction, torque alteration, flight path deviation, and the like thereof. In an embodiment, and without limitation, pilot signal 336 may include one or more explicit signals to reduce torque, and/or one or more implicit signals that torque may be reduced due to reduction of airspeed velocity. In an embodiment, and without limitation, pilot signal 336 may include one or more local and/or global signals. For example, and without limitation, pilot signal 336 may include a local signal that is transmitted by a pilot and/or crew member. As a further non-limiting example, pilot signal 336 may include a global signal that is transmitted by air traffic control and/or one or more remote users that are in communication with the pilot of aircraft. In an embodiment, pilot signal 336 may be received as a function of a tri-state bus and/or multiplexor that denotes an explicit pilot signal should be transmitted prior to any implicit or global pilot signal.

Still referring to FIG. 3, autonomous machine-learning model may include one or more autonomous machine-learning processes such as supervised, unsupervised, or reinforcement machine-learning processes that flight controller and/or a remote device may or may not use in the generation of autonomous function. As used in this disclosure, "remote device" is an external device to flight controller. Additionally or alternatively, autonomous machine-learning model may include one or more autonomous machine-learning processes that a field-programmable gate array (FPGA) may or may not use in the generation of autonomous function. Autonomous machine-learning process may include, without limitation machine learning processes such as simple linear regression, multiple linear regression, polynomial regression, support vector regression, ridge regression, lasso regression, elastic net regression, decision tree regression, random forest regression, logistic regression, logistic classification, K-nearest neighbors, support vector machines, kernel support vector machines, naïve bayes, decision tree classification, random forest classification, K-means clustering, hierarchical clustering, dimensionality reduction, principal component analysis, linear discriminant analysis, kernel principal component analysis, Q-learning, State Action Reward State Action (SARSA), Deep-Q network, Markov decision processes, Deep Deterministic Policy Gradient (DDPG), or the like thereof.

In an embodiment, and still referring to FIG. 3, autonomous machine learning model may be trained as a function of autonomous training data, wherein autonomous training data may correlate a flight element, pilot signal, and/or simulation data to an autonomous function. For example, and without limitation, a flight element of an airspeed velocity, a pilot signal of limited and/or no control of propulsors, and a simulation data of required airspeed velocity to reach the destination may result in an autonomous function that includes a semi-autonomous mode to increase thrust of the propulsors. Autonomous training data may be received as a function of user-entered valuations of flight elements, pilot signals, simulation data, and/or autonomous functions. Flight controller may receive autonomous training data by receiving correlations of flight element, pilot signal, and/or simulation data to an autonomous function that were previously received and/or determined during a previous iteration of generation of autonomous function. Autonomous training data may be received by one or more remote devices and/or FPGAs that at least correlate a flight element, pilot signal, and/or simulation data to an autonomous function. Autonomous training data may be received in the form of one or more user-entered correlations of a flight element, pilot signal, and/or simulation data to an autonomous function.

Still referring to FIG. 3, flight controller may receive autonomous machine-learning model from a remote device and/or FPGA that utilizes one or more autonomous machine learning processes, wherein a remote device and an FPGA is described above in detail. For example, and without limitation, a remote device may include a computing device, external device, processor, FPGA, microprocessor and the like thereof. Remote device and/or FPGA may perform the autonomous machine-learning process using autonomous training data to generate autonomous function and transmit the output to flight controller. Remote device and/or FPGA may transmit a signal, bit, datum, or parameter to flight controller that at least relates to autonomous function. Additionally or alternatively, remote device and/or FPGA may provide an updated machine-learning model. For example, and without limitation, an updated machine-learning model may be comprised of a firmware update, a software update, an autonomous machine-learning process correction, and the like thereof. As a non-limiting example a software update may incorporate a new simulation data that relates to a modified flight element. Additionally or alternatively, the updated machine learning model may be transmitted to remote device and/or FPGA, wherein remote device and/or FPGA may replace the autonomous machine-learning model with the updated machine-learning model and generate the autonomous function as a function of the flight element, pilot signal, and/or simulation data using the updated machine-learning model. The updated machine-learning model may be transmitted by remote device and/or FPGA and received by flight controller as a software update, firmware update, or corrected autonomous machine-learning model. For example, and without limitation autonomous machine learning model may utilize a neural net machine-learning process, wherein the updated machine-learning model may incorporate a gradient boosting machine-learning process.

Still referring to FIG. 3, flight controller may include, be included in, and/or communicate with a mobile device such as a mobile telephone or smartphone. Further, flight controller may communicate with one or more additional devices as described below in further detail via a network interface device. The network interface device may be utilized for commutatively connecting a flight controller to one or more of a variety of networks, and one or more devices. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. The network may include any network topology and can may employ a wired and/or a wireless mode of communication.

In an embodiment, and still referring to FIG. 3, flight controller may include, but is not limited to, for example, a cluster of flight controllers in a first location and a second flight controller or cluster of flight controllers in a second location. Flight controller may include one or more flight controllers dedicated to data storage, security, distribution of traffic for load balancing, and the like. Flight controller may be configured to distribute one or more computing tasks as described below across a plurality of flight controllers, which may operate in parallel, in series, redundantly, or in any other manner used for distribution of tasks or memory between computing devices. For example, and without limitation, flight controller may implement a control algorithm to distribute and/or command the plurality of flight controllers. As used in this disclosure a "control algorithm" is a finite sequence of well-defined computer implementable instructions that may determine the flight component of the plurality of flight components to be adjusted. For example, and without limitation, control algorithm may include one or more algorithms that reduce and/or prevent aviation asymmetry. As a further non-limiting example, control algorithms may include one or more models generated as a function of a software including, but not limited to Simulink by MathWorks, Natick, Mass., USA. In an embodiment, and without limitation, control algorithm may be configured to generate an auto-code, wherein an "auto-code," is used herein, is a code and/or algorithm that is generated as a function of the one or more models and/or software's. In another embodiment, control algorithm may be configured to produce a segmented control algorithm. As used in this disclosure a "segmented control algorithm" is control algorithm that has been separated and/or parsed into discrete sections. For example, and without limitation, segmented control algorithm may parse control algorithm into two or more segments, wherein each segment of control algorithm may be performed by one or more flight controllers operating on distinct flight components.

In an embodiment, and still referring to FIG. 3, control algorithm may be configured to determine a segmentation boundary as a function of segmented control algorithm. As used in this disclosure a "segmentation boundary" is a limit and/or delineation associated with the segments of the segmented control algorithm. For example, and without limitation, segmentation boundary may denote that a segment in the control algorithm has a first starting section and/or a first ending section. As a further non-limiting example, segmentation boundary may include one or more boundaries associated with an ability of flight component 108. In an embodiment, control algorithm may be configured to create an optimized signal communication as a function of segmentation boundary. For example, and without limitation, optimized signal communication may include identifying the discrete timing required to transmit and/or receive the one or more segmentation boundaries. In an embodiment, and without limitation, creating optimized signal communication further comprises separating a plurality of signal codes across the plurality of flight controllers. For example, and without limitation the plurality of flight controllers may include one or more formal networks, wherein formal networks transmit data along an authority chain and/or are limited to task-related communications. As a further non-limiting example, communication network may include informal networks, wherein informal networks transmit data in any direction. In an embodiment, and without limitation, the plurality of flight controllers may include a chain path, wherein a "chain path," as used herein, is a linear communication path comprising a hierarchy that data may flow through. In an embodiment, and without limitation, the plurality of flight controllers may include an all-channel path, wherein an "all-channel path," as used herein, is a communication path that is not restricted to a particular direction. For example, and without limitation, data may be transmitted upward, downward, laterally, and the like thereof. In an embodiment, and without limitation, the plurality of flight controllers may include one or more neural networks that assign a weighted value to a transmitted datum. For example, and without limitation, a weighted value may be assigned as a function of one or more signals denoting that a flight component is malfunctioning and/or in a failure state.

Still referring to FIG. 3, the plurality of flight controllers may include a master bus controller. As used in this disclosure a "master bus controller" is one or more devices and/or components that are connected to a bus to initiate a direct memory access transaction, wherein a bus is one or more terminals in a bus architecture. Master bus controller may communicate using synchronous and/or asynchronous bus control protocols. In an embodiment, master bus controller may include flight controller. In another embodiment, master bus controller may include one or more universal asynchronous receiver-transmitters (UART). For example, and without limitation, master bus controller may include one or more bus architectures that allow a bus to initiate a direct memory access transaction from one or more buses in the bus architectures. As a further non-limiting example, master bus controller may include one or more peripheral devices and/or components to communicate with another peripheral device and/or component and/or the master bus controller. In an embodiment, master bus controller may be configured to perform bus arbitration. As used in this disclosure "bus arbitration" is method and/or scheme to prevent multiple buses from attempting to communicate with and/or connect to master bus controller. For example and without limitation, bus arbitration may include one or more schemes such as a small computer interface system, wherein a small computer interface system is a set of standards for physical connecting and transferring data between peripheral devices and master bus controller by defining commands, protocols, electrical, optical, and/or logical interfaces. In an embodiment, master bus controller may receive intermediate representation 312 and/or output language from logic component 320, wherein output language may include one or more analog-to-digital conversions, low bit rate transmissions, message encryptions, digital signals, binary signals, logic signals, analog signals, and the like thereof described above in detail.

Still referring to FIG. 3, master bus controller may communicate with a slave bus. As used in this disclosure a "slave bus" is one or more peripheral devices and/or components that initiate a bus transfer. For example, and without limitation, slave bus may receive one or more controls and/or asymmetric communications from master bus controller, wherein slave bus transfers data stored to master bus controller. In an embodiment, and without limitation, slave bus may include one or more internal buses, such as but not limited to a/an internal data bus, memory bus, system bus, front-side bus, and the like thereof. In another embodiment, and without limitation, slave bus may include one or more external buses such as external flight controllers, external computers, remote devices, printers, aircraft computer systems, flight control systems, and the like thereof.

In an embodiment, and still referring to FIG. 3, control algorithm may optimize signal communication as a function of determining one or more discrete timings. For example, and without limitation master bus controller may synchronize timing of the segmented control algorithm by injecting high priority timing signals on a bus of the master bus control. As used in this disclosure a "high priority timing signal" is information denoting that the information is important. For example, and without limitation, high priority timing signal may denote that a section of control algorithm is of high priority and should be analyzed and/or transmitted prior to any other sections being analyzed and/or transmitted. In an embodiment, high priority timing signal may include one or more priority packets. As used in this disclosure a "priority packet" is a formatted unit of data that is communicated between the plurality of flight controllers. For example, and without limitation, priority packet may denote that a section of control algorithm should be used and/or is of greater priority than other sections.

Still referring to FIG. 3, flight controller may also be implemented using a "shared nothing" architecture in which data is cached at the worker, in an embodiment, this may enable scalability of aircraft and/or computing device. Flight controller may include a distributer flight controller. As used in this disclosure a "distributer flight controller" is a component that adjusts and/or controls a plurality of flight components as a function of a plurality of flight controllers. For example, distributer flight controller may include a flight controller that communicates with a plurality of additional flight controllers and/or clusters of flight controllers. In an embodiment, distributed flight control may include one or more neural networks. For example, neural network also known as an artificial neural network, is a network of "nodes," or data structures having one or more inputs, one or more outputs, and a function determining outputs based on inputs. Such nodes may be organized in a network, such as without limitation a convolutional neural network, including an input layer of nodes, one or more intermediate layers, and an output layer of nodes. Connections between nodes may be created via the process of "training" the network, in which elements from a training dataset are applied to the input nodes, a suitable training algorithm (such as Levenberg-Marquardt, conjugate gradient, simulated annealing, or other algorithms) is then used to adjust the connections and weights between nodes in adjacent layers of the neural network to produce the desired values at the output nodes. This process is sometimes referred to as deep learning.

Still referring to FIG. 3, a node may include, without limitation a plurality of inputs $x_i$ that may receive numerical values from inputs to a neural network containing the node and/or from other nodes. Node may perform a weighted sum of inputs using weights $w_i$ that are multiplied by respective inputs $x_i$. Additionally or alternatively, a bias b may be added to the weighted sum of the inputs such that an offset is added to each unit in the neural network layer that is independent of the input to the layer. The weighted sum may then be input into a function φ, which may generate one or more outputs y. Weight $w_i$ applied to an input $x_i$ may indicate whether the input is "excitatory," indicating that it has strong influence on the one or more outputs y, for instance by the corresponding weight having a large numerical value, and/or a "inhibitory," indicating it has a weak effect influence on the one more inputs y, for instance by the corresponding weight having a small numerical value. The values of weights $w_i$ may be determined by training a neural network using training data, which may be performed using any suitable process as described above. In an embodiment, and without limitation, a neural network may receive semantic units as inputs and output vectors representing such semantic units according to weights $w_i$ that are derived using machine-learning processes as described in this disclosure.

Still referring to FIG. 3, flight controller may include a sub-controller 340. As used in this disclosure a "sub-controller" is a controller and/or component that is part of a distributed controller as described above; for instance, flight controller may be and/or include a distributed flight controller made up of one or more sub-controllers. For example, and without limitation, sub-controller 340 may include any controllers and/or components thereof that are similar to distributed flight controller and/or flight controller as described above. Sub-controller 340 may include any component of any flight controller as described above. Sub-controller 340 may be implemented in any manner suitable for implementation of a flight controller as described above. As a further non-limiting example, sub-controller 340 may include one or more processors, logic components and/or computing devices capable of receiving, processing, and/or transmitting data across the distributed flight controller as described above. As a further non-limiting example, sub-controller 340 may include a controller that receives a signal from a first flight controller and/or first distributed flight controller component and transmits the signal to a plurality of additional sub-controllers and/or flight components.

Still referring to FIG. 3, flight controller may include a co-controller 344. As used in this disclosure a "co-controller" is a controller and/or component that joins flight controller as components and/or nodes of a distributer flight controller as described above. For example, and without limitation, co-controller 344 may include one or more controllers and/or components that are similar to flight controller. As a further non-limiting example, co-controller 344 may include any controller and/or component that joins flight controller to distributer flight controller. As a further non-limiting example, co-controller 344 may include one or more processors, logic components and/or computing devices capable of receiving, processing, and/or transmitting data to and/or from flight controller to distributed flight control system. Co-controller 344 may include any component of any flight controller as described above. Co-controller 344 may be implemented in any manner suitable for implementation of a flight controller as described above.

In an embodiment, and with continued reference to FIG. 3, flight controller may be designed and/or configured to perform any method, method step, or sequence of method steps in any embodiment described in this disclosure, in any order and with any degree of repetition. For instance, flight controller may be configured to perform a single step or sequence repeatedly until a desired or commanded outcome is achieved; repetition of a step or a sequence of steps may be performed iteratively and/or recursively using outputs of previous repetitions as inputs to subsequent repetitions, aggregating inputs and/or outputs of repetitions to produce an aggregate result, reduction or decrement of one or more variables such as global variables, and/or division of a larger processing task into a set of iteratively addressed smaller processing tasks. Flight controller may perform any step or sequence of steps as described in this disclosure in parallel, such as simultaneously and/or substantially simultaneously performing a step two or more times using two or more parallel threads, processor cores, or the like; division of tasks between parallel threads and/or processes may be performed according to any protocol suitable for division of tasks between iterations. Persons skilled in the art, upon reviewing the entirety of this disclosure, will be aware of various ways in which steps, sequences of steps, processing tasks, and/or data may be subdivided, shared, or otherwise dealt with using iteration, recursion, and/or parallel processing.

Figure 4:
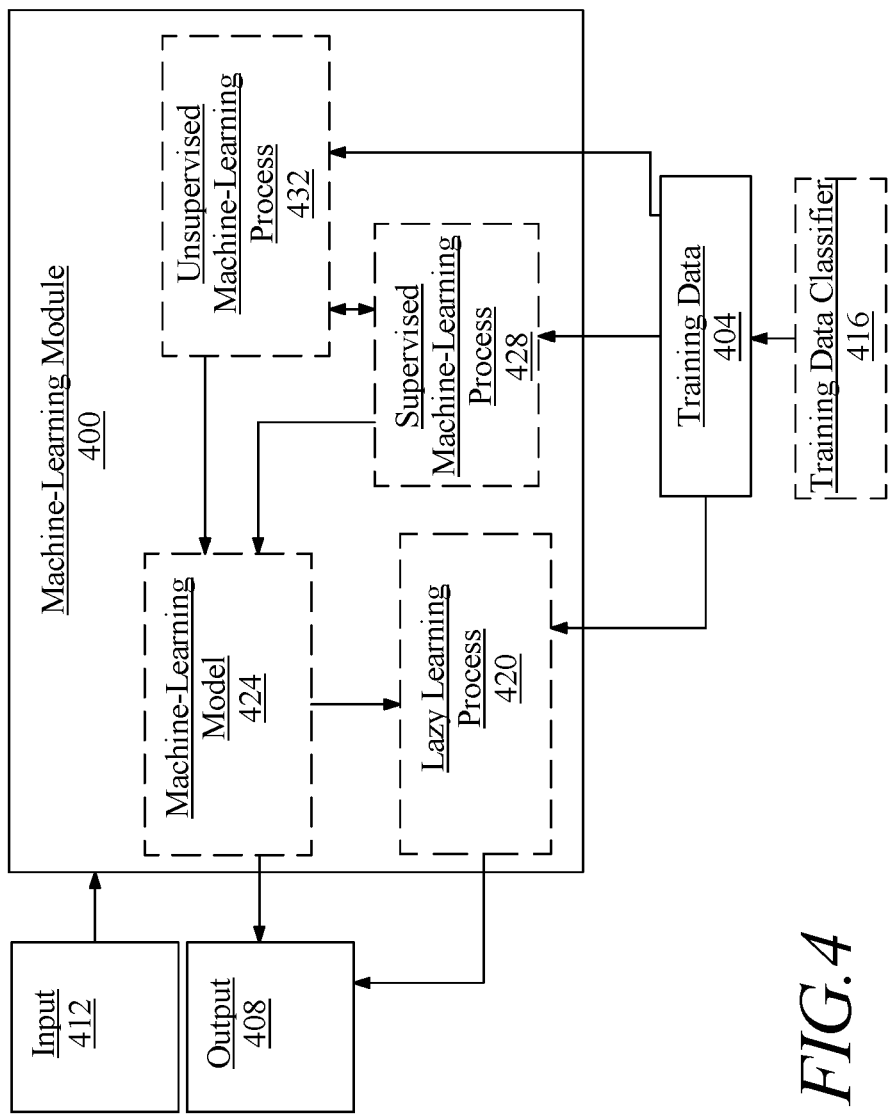
FIG. 4 is a block diagram of an exemplary embodiment of a machine-learning module.

Referring now to FIG. 4, an exemplary embodiment of a machine-learning module 400 that may perform one or more machine-learning processes as described in this disclosure is illustrated. Machine-learning module may perform determinations, classification, and/or analysis steps, methods, processes, or the like as described in this disclosure using machine learning processes. A "machine learning process," as used in this disclosure, is a process that automatedly uses training data 404 to generate an algorithm that will be performed by a computing device/module to produce outputs 408 given data provided as inputs 412; this is in contrast to a non-machine learning software program where the commands to be executed are determined in advance by a user and written in a programming language.

Still referring to FIG. 4, "training data," as used herein, is data containing correlations that a machine-learning process may use to model relationships between two or more categories of data elements. For instance, and without limitation, training data 404 may include a plurality of data entries, each entry representing a set of data elements that were recorded, received, and/or generated together; data elements may be correlated by shared existence in a given data entry, by proximity in a given data entry, or the like. Multiple data entries in training data 404 may evince one or more trends in correlations between categories of data elements; for instance, and without limitation, a higher value of a first data element belonging to a first category of data element may tend to correlate to a higher value of a second data element belonging to a second category of data element, indicating a possible proportional or other mathematical relationship linking values belonging to the two categories. Multiple categories of data elements may be related in training data 404 according to various correlations; correlations may indicate causative and/or predictive links between categories of data elements, which may be modeled as relationships such as mathematical relationships by machine-learning processes as described in further detail below. Training data 404 may be formatted and/or organized by categories of data elements, for instance by associating data elements with one or more descriptors corresponding to categories of data elements. As a non-limiting example, training data 404 may include data entered in standardized forms by persons or processes, such that entry of a given data element in a given field in a form may be mapped to one or more descriptors of categories. Elements in training data 404 may be linked to descriptors of categories by tags, tokens, or other data elements; for instance, and without limitation, training data 404 may be provided in fixed-length formats, formats linking positions of data to categories such as comma-separated value (CSV) formats and/or self-describing formats such as extensible markup language (XML), JavaScript Object Notation (JSON), or the like, enabling processes or devices to detect categories of data.

Alternatively or additionally, and continuing to refer to FIG. 4, training data 404 may include one or more elements that are not categorized; that is, training data 404 may not be formatted or contain descriptors for some elements of data. Machine-learning algorithms and/or other processes may sort training data 404 according to one or more categorizations using, for instance, natural language processing algorithms, tokenization, detection of correlated values in raw data and the like; categories may be generated using correlation and/or other processing algorithms. As a non-limiting example, in a corpus of text, phrases making up a number "n" of compound words, such as nouns modified by other nouns, may be identified according to a statistically significant prevalence of n-grams containing such words in a particular order; such an n-gram may be categorized as an element of language such as a "word" to be tracked similarly to single words, generating a new category as a result of statistical analysis. Similarly, in a data entry including some textual data, a person's name may be identified by reference to a list, dictionary, or other compendium of terms, permitting ad-hoc categorization by machine-learning algorithms, and/or automated association of data in the data entry with descriptors or into a given format. The ability to categorize data entries automatedly may enable the same training data 404 to be made applicable for two or more distinct machine-learning algorithms as described in further detail below. Training data 404 used by machine-learning module 400 may correlate any input data as described in this disclosure to any output data as described in this disclosure. As a non-limiting illustrative example flight elements and/or pilot signals may be inputs, wherein an output may be an autonomous function.

Further referring to FIG. 4, training data may be filtered, sorted, and/or selected using one or more supervised and/or unsupervised machine-learning processes and/or models as described in further detail below; such models may include without limitation a training data classifier 416. Training data classifier 416 may include a "classifier," which as used in this disclosure is a machine-learning model as defined below, such as a mathematical model, neural net, or program generated by a machine learning algorithm known as a "classification algorithm," as described in further detail below, that sorts inputs into categories or bins of data, outputting the categories or bins of data and/or labels associated therewith. A classifier may be configured to output at least a datum that labels or otherwise identifies a set of data that are clustered together, found to be close under a distance metric as described below, or the like. Machine-learning module 400 may generate a classifier using a classification algorithm, defined as a processes whereby a computing device and/or any module and/or component operating thereon derives a classifier from training data 404. Classification may be performed using, without limitation, linear classifiers such as without limitation logistic regression and/or naive Bayes classifiers, nearest neighbor classifiers such as k-nearest neighbors classifiers, support vector machines, least squares support vector machines, fisher's linear discriminant, quadratic classifiers, decision trees, boosted trees, random forest classifiers, learning vector quantization, and/or neural network-based classifiers. As a non-limiting example, training data classifier 416 may classify elements of training data to sub-categories of flight elements such as torques, forces, thrusts, directions, and the like thereof.

Still referring to FIG. 4, machine-learning module 400 may be configured to perform a lazy-learning process 420 and/or protocol, which may alternatively be referred to as a "lazy loading" or "call-when-needed" process and/or protocol, may be a process whereby machine learning is conducted upon receipt of an input to be converted to an output, by combining the input and training set to derive the algorithm to be used to produce the output on demand. For instance, an initial set of simulations may be performed to cover an initial heuristic and/or "first guess" at an output and/or relationship. As a non-limiting example, an initial heuristic may include a ranking of associations between inputs and elements of training data 404. Heuristic may include selecting some number of highest-ranking associations and/or training data 404 elements. Lazy learning may implement any suitable lazy learning algorithm, including without limitation a K-nearest neighbors algorithm, a lazy naïve Bayes algorithm, or the like; persons skilled in the art, upon reviewing the entirety of this disclosure, will be aware of various lazy-learning algorithms that may be applied to generate outputs as described in this disclosure, including without limitation lazy learning applications of machine-learning algorithms as described in further detail below.

Alternatively or additionally, and with continued reference to FIG. 4, machine-learning processes as described in this disclosure may be used to generate machine-learning models 424. A "machine-learning model," as used in this disclosure, is a mathematical and/or algorithmic representation of a relationship between inputs and outputs, as generated using any machine-learning process including without limitation any process as described above and stored in memory; an input is submitted to a machine-learning model 424 once created, which generates an output based on the relationship that was derived. For instance, and without limitation, a linear regression model, generated using a linear regression algorithm, may compute a linear combination of input data using coefficients derived during machine-learning processes to calculate an output datum. As a further non-limiting example, a machine-learning model 424 may be generated by creating an artificial neural network, such as a convolutional neural network comprising an input layer of nodes, one or more intermediate layers, and an output layer of nodes. Connections between nodes may be created via the process of "training" the network, in which elements from a training data 404 set are applied to the input nodes, a suitable training algorithm (such as Levenberg-Marquardt, conjugate gradient, simulated annealing, or other algorithms) is then used to adjust the connections and weights between nodes in adjacent layers of the neural network to produce the desired values at the output nodes. This process is sometimes referred to as deep learning.

Still referring to FIG. 4, machine-learning algorithms may include at least a supervised machine-learning process 428. At least a supervised machine-learning process 428, as defined herein, include algorithms that receive a training set relating a number of inputs to a number of outputs, and seek to find one or more mathematical relations relating inputs to outputs, where each of the one or more mathematical relations is optimal according to some criterion specified to the algorithm using some scoring function. For instance, a supervised learning algorithm may include flight elements and/or pilot signals as described above as inputs, autonomous functions as outputs, and a scoring function representing a desired form of relationship to be detected between inputs and outputs; scoring function may, for instance, seek to maximize the probability that a given input and/or combination of elements inputs is associated with a given output to minimize the probability that a given input is not associated with a given output. Scoring function may be expressed as a risk function representing an "expected loss" of an algorithm relating inputs to outputs, where loss is computed as an error function representing a degree to which a prediction generated by the relation is incorrect when compared to a given input-output pair provided in training data 404. Persons skilled in the art, upon reviewing the entirety of this disclosure, will be aware of various possible variations of at least a supervised machine-learning process 428 that may be used to determine relation between inputs and outputs. Supervised machine-learning processes may include classification algorithms as defined above.

Further referring to FIG. 4, machine learning processes may include at least an unsupervised machine-learning processes 432. An unsupervised machine-learning process, as used herein, is a process that derives inferences in datasets without regard to labels; as a result, an unsupervised machine-learning process may be free to discover any structure, relationship, and/or correlation provided in the data. Unsupervised processes may not require a response variable; unsupervised processes may be used to find interesting patterns and/or inferences between variables, to determine a degree of correlation between two or more variables, or the like.

Still referring to FIG. 4, machine-learning module 400 may be designed and configured to create a machine-learning model 424 using techniques for development of linear regression models. Linear regression models may include ordinary least squares regression, which aims to minimize the square of the difference between predicted outcomes and actual outcomes according to an appropriate norm for measuring such a difference (e.g. a vector-space distance norm); coefficients of the resulting linear equation may be modified to improve minimization. Linear regression models may include ridge regression methods, where the function to be minimized includes the least-squares function plus term multiplying the square of each coefficient by a scalar amount to penalize large coefficients. Linear regression models may include least absolute shrinkage and selection operator (LASSO) models, in which ridge regression is combined with multiplying the least-squares term by a factor of 1 divided by double the number of samples. Linear regression models may include a multi-task lasso model wherein the norm applied in the least-squares term of the lasso model is the Frobenius norm amounting to the square root of the sum of squares of all terms. Linear regression models may include the elastic net model, a multi-task elastic net model, a least angle regression model, a LARS lasso model, an orthogonal matching pursuit model, a Bayesian regression model, a logistic regression model, a stochastic gradient descent model, a perceptron model, a passive aggressive algorithm, a robustness regression model, a Huber regression model, or any other suitable model that may occur to persons skilled in the art upon reviewing the entirety of this disclosure. Linear regression models may be generalized in an embodiment to polynomial regression models, whereby a polynomial equation (e.g. a quadratic, cubic or higher-order equation) providing a best predicted output/actual output fit is sought; similar methods to those described above may be applied to minimize error functions, as will be apparent to persons skilled in the art upon reviewing the entirety of this disclosure.

Continuing to refer to FIG. 4, machine-learning algorithms may include, without limitation, linear discriminant analysis. Machine-learning algorithm may include quadratic discriminate analysis. Machine-learning algorithms may include kernel ridge regression. Machine-learning algorithms may include support vector machines, including without limitation support vector classification-based regression processes. Machine-learning algorithms may include stochastic gradient descent algorithms, including classification and regression algorithms based on stochastic gradient descent. Machine-learning algorithms may include nearest neighbors algorithms. Machine-learning algorithms may include Gaussian processes such as Gaussian Process Regression. Machine-learning algorithms may include cross-decomposition algorithms, including partial least squares and/or canonical correlation analysis. Machine-learning algorithms may include naïve Bayes methods. Machine-learning algorithms may include algorithms based on decision trees, such as decision tree classification or regression algorithms. Machine-learning algorithms may include ensemble methods such as bagging meta-estimator, forest of randomized tress, AdaBoost, gradient tree boosting, and/or voting classifier methods. Machine-learning algorithms may include neural net algorithms, including convolutional neural net processes.

Figure 5:
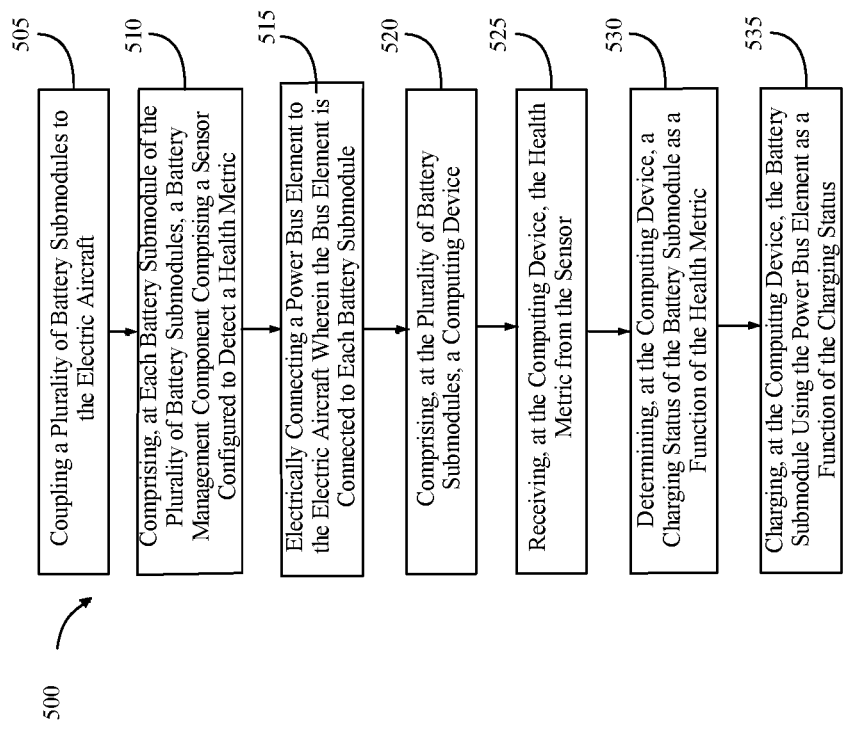
FIG. 5 is a flow diagram of an exemplary embodiment of a method for a monitoring system for charging multiple battery packs in an electric aircraft.

Now referring to FIG. 5, an exemplary embodiment of a method 500 for a monitoring system of charging multiple battery packs in an electric aircraft. The electric aircraft may include, but without limitation, any of the aircraft as disclosed herein and described above with reference to at least FIG. 1.

Still referring to FIG. 5, at step 505, method 500 includes coupling a plurality of battery submodules 204 to electric aircraft 100. The plurality of battery submodules may include, but without limitation, any of the submodules as disclosed herein and described above with reference to at least FIG. 2.

Still referring to FIG. 5, at step 510, method 500 includes comprising, at each battery submodule of the plurality of battery submodules 204, a battery management component 208 comprising a sensor 212 configured to detect a health metric. Health metric may include a discharge-related fault condition. Health metric may include a cell charge capacity. Charge-and-update includes generating updated charge capacity values for at least one cell in the given battery submodule. The plurality of battery submodules may include, but without limitation, any of the submodules as disclosed herein and described above with reference to at least FIG. 2. The battery management component may include, but without limitation, any of the battery management components as disclosed herein and described above with reference to at least FIG. 2. The sensor may include, but without limitation, any of the sensors as disclosed herein and described above with reference to at least FIG. 2. The health metric may include, but without limitation, any of the health metrics as disclosed herein and described above with reference to at least FIG. 2.

Still referring to FIG. 5, at step 515, method 500 includes electrically connecting a power bus element 216 to electric aircraft 100 wherein the bus element is electrically connected to each battery submodule of the plurality of battery submodules 204. The power bus element may include, but without limitation, any of the bus elements as disclosed herein and described above with reference to at least FIG. 2. The battery submodules may include, but without limitation, any of the submodules as disclosed herein and described above with reference to at least FIG. 2.

Still referring to FIG. 5, at step 520, method 500 includes comprising, at the plurality of battery submodules 204, a computing device 220. Computing devices 220 periodically perform the charge-and-update. The determination to perform the charge-and-update is based at least in part on a current cycle number associated with the charge-and-update. The determination to perform the charge-and-update is based at least in part on a maximum cell voltage being less than an updated threshold voltage. Charge-and-update will not be performed periodically when some state or condition has been met in the battery submodule. The battery submodules may include, but without limitation, any of the submodules as disclosed herein and described above with reference to at least FIG. 2. The computing devices may include, but without limitation, any of the computing devices as disclosed herein and described above with reference to at least FIG. 2-3.

Still referring to FIG. 5, at step 525, method 500 includes receiving, at the computing device 220, the health metric from the sensor 212. The computing devices may include, but without limitation, any of the computing devices as disclosed herein and described above with reference to at least FIG. 2-3. The health metric may include, but without limitation, any of the health metrics as disclosed herein and described above with reference to at least FIG. 2. The sensor may include, but without limitation, any of the sensors as disclosed herein and described above with reference to at least FIG. 2.

Still referring to FIG. 5, at step 530, method 500 includes determining, at the computing device 220, a charging status of the battery submodule 204 as a function of the health metric. Charging status may be displayed to a user through a remote device. The computing devices may include, but without limitation, any of the computing devices as disclosed herein and described above with reference to at least FIG. 2-3. The charging status may include, but without limitation, any of the charging statuses as disclosed herein and described above with reference to at least FIG. 2. The health metric may include, but without limitation, any of the health metrics as disclosed herein and described above with reference to at least FIG. 2.

Still referring to FIG. 5, at step 535, method 500 includes charging, at the computing device 220, the battery submodules 204 using the power bus element 216 as a function of the charging status. Charging the selected battery submodules further includes determining to perform a charge-only including exercising the given battery submodule without updating a health metric. The computing devices may include, but without limitation, any of the computing devices as disclosed herein and described above with reference to at least FIG. 2-3. The battery submodules may include, but without limitation, any of the submodules as disclosed herein and described above with reference to at least FIG. 2. The charging status may include, but without limitation, any of the charging statuses as disclosed herein and described above with reference to at least FIG. 2.

It is to be noted that any one or more of the aspects and embodiments described herein may be conveniently implemented using one or more machines (e.g., one or more computing devices that are utilized as a user computing device for an electronic document, one or more server devices, such as a document server, etc.) programmed according to the teachings of the present specification, as will be apparent to those of ordinary skill in the computer art. Appropriate software coding can readily be prepared by skilled programmers based on the teachings of the present disclosure, as will be apparent to those of ordinary skill in the software art. Aspects and implementations discussed above employing software and/or software modules may also include appropriate hardware for assisting in the implementation of the machine executable instructions of the software and/or software module.

Such software may be a computer program product that employs a machine-readable storage medium. A machine-readable storage medium may be any medium that is capable of storing and/or encoding a sequence of instructions for execution by a machine (e.g., a computing device) and that causes the machine to perform any one of the methodologies and/or embodiments described herein. Examples of a machine-readable storage medium include, but are not limited to, a magnetic disk, an optical disc (e.g., CD, CD-R, DVD, DVD-R, etc.), a magneto-optical disk, a read-only memory "ROM" device, a random-access memory "RAM" device, a magnetic card, an optical card, a solid-state memory device, an EPROM, an EEPROM, and any combinations thereof. A machine-readable medium, as used herein, is intended to include a single medium as well as a collection of physically separate media, such as, for example, a collection of compact discs or one or more hard disk drives in combination with a computer memory. As used herein, a machine-readable storage medium does not include transitory forms of signal transmission.

Such software may also include information (e.g., data) carried as a data signal on a data carrier, such as a carrier wave. For example, machine-executable information may be included as a data-carrying signal embodied in a data carrier in which the signal encodes a sequence of instruction, or portion thereof, for execution by a machine (e.g., a computing device) and any related information (e.g., data structures and data) that causes the machine to perform any one of the methodologies and/or embodiments described herein.

Examples of a computing device include, but are not limited to, an electronic book reading device, a computer workstation, a terminal computer, a server computer, a handheld device (e.g., a tablet computer, a smartphone, etc.), a web appliance, a network router, a network switch, a network bridge, any machine capable of executing a sequence of instructions that specify an action to be taken by that machine, and any combinations thereof. In one example, a computing device may include and/or be included in a kiosk.

Figure 6:
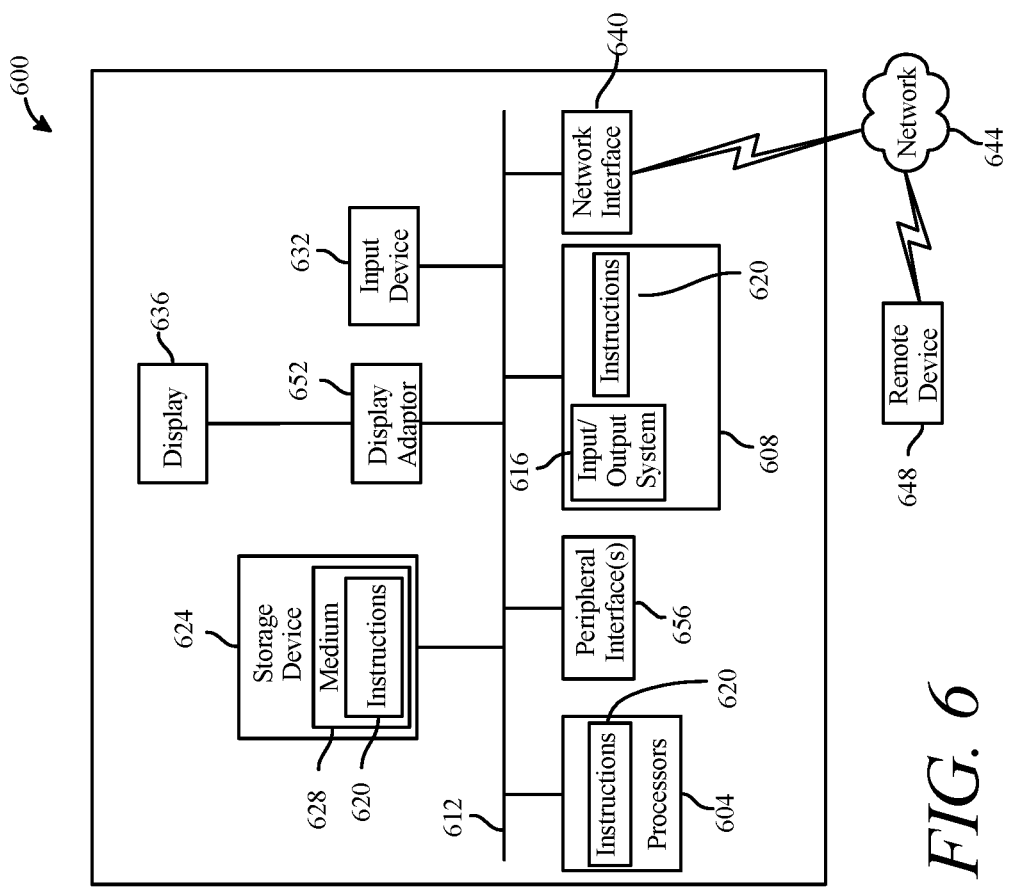
FIG. 6 is a block diagram of a computing system that can be used to implement any one or more of the methodologies disclosed herein and any one or more portions thereof.

FIG. 6 shows a diagrammatic representation of one embodiment of a computing device in the exemplary form of a computer system 600 within which a set of instructions for causing a control system to perform any one or more of the aspects and/or methodologies of the present disclosure may be executed. It is also contemplated that multiple computing devices may be utilized to implement a specially configured set of instructions for causing one or more of the devices to perform any one or more of the aspects and/or methodologies of the present disclosure. Computer system 600 includes a processor 604 and a memory 608 that communicate with each other, and with other components, via a bus 612. Bus 612 may include any of several types of bus structures including, but not limited to, a memory bus, a memory controller, a peripheral bus, a local bus, and any combinations thereof, using any of a variety of bus architectures.

Processor 604 may include any suitable processor, such as without limitation a processor incorporating logical circuitry for performing arithmetic and logical operations, such as an arithmetic and logic unit (ALU), which may be regulated with a state machine and directed by operational inputs from memory and/or sensors; processor 604 may be organized according to Von Neumann and/or Harvard architecture as a non-limiting example. Processor 604 may include, incorporate, and/or be incorporated in, without limitation, a microcontroller, microprocessor, digital signal processor (DSP), Field Programmable Gate Array (FPGA), Complex Programmable Logic Device (CPLD), Graphical Processing Unit (GPU), general purpose GPU, Tensor Processing Unit (TPU), analog or mixed signal processor, Trusted Platform Module (TPM), a floating point unit (FPU), and/or system on a chip (SoC).

Memory 608 may include various components (e.g., machine-readable media) including, but not limited to, a random-access memory component, a read only component, and any combinations thereof. In one example, a basic input/output system 616 (BIOS), including basic routines that help to transfer information between elements within computer system 600, such as during start-up, may be stored in memory 608. Memory 608 may also include (e.g., stored on one or more machine-readable media) instructions (e.g., software) 620 embodying any one or more of the aspects and/or methodologies of the present disclosure. In another example, memory 608 may further include any number of program modules including, but not limited to, an operating system, one or more application programs, other program modules, program data, and any combinations thereof.

Computer system 600 may also include a storage device 624. Examples of a storage device (e.g., storage device 624) include, but are not limited to, a hard disk drive, a magnetic disk drive, an optical disc drive in combination with an optical medium, a solid-state memory device, and any combinations thereof. Storage device 624 may be connected to bus 612 by an appropriate interface (not shown). Example interfaces include, but are not limited to, SCSI, advanced technology attachment (ATA), serial ATA, universal serial bus (USB), IEEE 1394 (FIREWIRE), and any combinations thereof. In one example, storage device 624 (or one or more components thereof) may be removably interfaced with computer system 600 (e.g., via an external port connector (not shown)). Particularly, storage device 624 and an associated machine-readable medium 628 may provide nonvolatile and/or volatile storage of machine-readable instructions, data structures, program modules, and/or other data for computer system 600. In one example, software 620 may reside, completely or partially, within machine-readable medium 628. In another example, software 620 may reside, completely or partially, within processor 604.

Computer system 600 may also include an input device 632. In one example, a user of computer system 600 may enter commands and/or other information into computer system 600 via input device 632. Examples of an input device 632 include, but are not limited to, an alpha-numeric input device (e.g., a keyboard), a pointing device, a joystick, a gamepad, an audio input device (e.g., a microphone, a voice response system, etc.), a cursor control device (e.g., a mouse), a touchpad, an optical scanner, a video capture device (e.g., a still camera, a video camera), a touchscreen, and any combinations thereof. Input device 632 may be interfaced to bus 612 via any of a variety of interfaces (not shown) including, but not limited to, a serial interface, a parallel interface, a game port, a USB interface, a FIREWIRE interface, a direct interface to bus 612, and any combinations thereof. Input device 632 may include a touch screen interface that may be a part of or separate from display 636, discussed further below. Input device 632 may be utilized as a user selection device for selecting one or more graphical representations in a graphical interface as described above.

A user may also input commands and/or other information to computer system 600 via storage device 624 (e.g., a removable disk drive, a flash drive, etc.) and/or network interface device 640. A network interface device, such as network interface device 640, may be utilized for connecting computer system 600 to one or more of a variety of networks, such as network 644, and one or more remote devices 648 connected thereto. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. A network, such as network 644, may employ a wired and/or a wireless mode of communication. In general, any network topology may be used. Information (e.g., data, software 620, etc.) may be communicated to and/or from computer system 600 via network interface device 640.

Computer system 600 may further include a video display adapter 652 for communicating a displayable image to a display device, such as display device 636. Examples of a display device include, but are not limited to, a liquid crystal display (LCD), a cathode ray tube (CRT), a plasma display, a light emitting diode (LED) display, and any combinations thereof. Display adapter 652 and display device 636 may be utilized in combination with processor 604 to provide graphical representations of aspects of the present disclosure. In addition to a display device, computer system 600 may include one or more other peripheral output devices including, but not limited to, an audio speaker, a printer, and any combinations thereof. Such peripheral output devices may be connected to bus 612 via a peripheral interface 656. Examples of a peripheral interface include, but are not limited to, a serial port, a USB connection, a FIREWIRE connection, a parallel connection, and any combinations thereof.

The foregoing has been a detailed description of illustrative embodiments of the invention. Various modifications and additions can be made without departing from the spirit and scope of this invention. Features of each of the various embodiments described above may be combined with features of other described embodiments as appropriate in order to provide a multiplicity of feature combinations in associated new embodiments. Furthermore, while the foregoing describes a number of separate embodiments, what has been described herein is merely illustrative of the application of the principles of the present invention. Additionally, although particular methods herein may be illustrated and/or described as being performed in a specific order, the ordering is highly variable within ordinary skill to achieve systems and methods according to the present disclosure. Accordingly, this description is meant to be taken only by way of example, and not to otherwise limit the scope of this invention.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A monitoring system for charging multiple battery packs in an electric aircraft, the system comprising:
a plurality of battery submodules included in an electric aircraft, wherein each battery submodule comprises:
a battery management component comprising a sensor configured to detect an altitude value and a health metric;
a power bus element comprising at least a ring bus, wherein the power bus element is electrically connected to each battery submodule of the plurality of battery submodules;
a computing device communicatively connected to each battery submodule, wherein the computing device is configured to:
receive the health metric from the sensor;
determine a charging status of each of the plurality of battery submodules as a function of the health metric, wherein a charge capacity value of the health metric is compared to a charge threshold value;
displaying the charging status for each of the plurality of battery submodules to the user using a stereoscopic display;
selectively charge each of the plurality of battery submodules using the power bus element as a function of the determined charging status for each battery submodule of the plurality of battery submodules, wherein the battery submodules are charged by the power bus element when the charge capacity value does not surpass the charge threshold value; and
periodically perform a charge-and-update process, wherein the charge-and-update process includes generating updated charge capacity values for at least one cell in the given battery submodule.

2. The system of claim 1, wherein the computing device periodically detects the health datum using the sensor.

3. The system of claim 2, wherein the determination to detect the health metric using the sensor is based at least in part on a current cycle number associated with the detecting the health metric.

4. The system of claim 2, wherein the determination to detect the health metric using the sensor is based on a maximum cell voltage of the battery being less than an updated threshold voltage of the battery.

5. The system of claim 1, wherein the health metric includes a discharge-related fault condition.

6. The system of claim 1, wherein the health metric may include a cell charge capacity.

7. The system of claim 1, wherein the charging status may be displayed to a user through a remote device.

8. The system of claim 1, wherein the charge-and-update will not be performed periodically when some state or condition has been met in the battery submodule.

9. The system of claim 1, wherein charging of the battery submodules further includes determining to perform a charge-only process, the charge-only process including exercising the given battery submodule without updating a health metric.

10. A method for a monitoring system for charging multiple battery packs in an electric aircraft, the method comprising:
coupling a plurality of battery submodules to the electric aircraft;
comprising, at each battery submodule of the plurality of battery submodules, a battery management component comprising a sensor configured to detect an altitude value and a health metric;
electrically connecting a power bus element, comprising at least a ring bus, to the electric aircraft wherein the bus element is electrically connected to each battery submodule of the plurality of battery submodules;
commutatively connecting, at the plurality of battery submodules, a computing device to each battery submodule;
receiving, at the computing device, the health metric from the sensor;
determining, at the computing device, a charging status of each of the plurality of battery submodules as a function of the health metric, wherein a charge capacity value of the health metric is compared to a charge threshold value;
displaying, at the computing device, the charging status for each of the plurality of battery submodules to the user using a stereoscopic display;
selectively charging, at the computing device, each of the plurality of battery submodules using the power bus element as a function of the determined charging status for each battery submodule of the plurality of battery submodules, wherein the battery submodules are charged by the power bus element when the charge capacity value does not surpass the charge threshold value; and
periodically performing, by the computing device, a charge-and-update process, wherein the charge-and-update process includes generating updated charge capacity values for at least one cell in the given battery submodule.

11. The method of claim 10, wherein the computing device periodically detects the health datum using the sensor.

12. The method of claim 11, wherein the determination to detect the health metric using the sensor is based at least in part on a current cycle number associated with the detecting the health metric.

13. The method of claim 11, wherein the determination to detect the health metric using the sensor is based on a maximum cell voltage of the battery being less than an updated threshold voltage of the battery.

14. The method of claim 10, wherein the health metric includes a discharge-related fault condition.

15. The method of claim 10, wherein the health metric may include a cell charge capacity.

16. The method of claim 10, wherein the charging status may be displayed to a user through a remote device.

17. The method of claim 10, wherein the charge-and-update will not be performed periodically when some state or condition has been met in the battery submodule.

18. The method of claim 10, wherein charging of the battery submodules further includes determining to perform a charge-only process, the charge-only process including exercising the given battery submodule without updating a health metric.

* * * * *